United States Patent [19]

Iwamatsu et al.

[11] Patent Number: 5,656,842

[45] Date of Patent: Aug. 12, 1997

[54] VERTICAL MOSFET INCLUDING A BACK GATE ELECTRODE

[75] Inventors: Toshiaki Iwamatsu; Yasuo Inoue, both of Tokyo, Japan

[73] Assignee: Mitsubishi Denki Kabushiki Kaisha, Tokyo, Japan

[21] Appl. No.: 587,788

[22] Filed: Dec. 26, 1995

[30] Foreign Application Priority Data

Jun. 20, 1995 [JP] Japan ................. 7-153483

[51] Int. Cl.$^6$ .............................. H01L 21/28
[52] U.S. Cl. .............................. 257/329; 257/623
[58] Field of Search .................. 257/329–334, 257/302, 623

[56] References Cited

U.S. PATENT DOCUMENTS

| | | | |
|---|---|---|---|
| 4,670,768 | 6/1987 | Sunami et al. | 257/329 |
| 4,975,754 | 12/1990 | Ishiuchi et al. | 257/365 |
| 5,047,812 | 9/1991 | Pfiester | 257/330 |
| 5,057,896 | 10/1991 | Gotou | 257/329 |
| 5,060,029 | 10/1991 | Nishizawa et al. | 257/329 |
| 5,177,027 | 1/1993 | Lowrey et al. | 257/623 |
| 5,225,701 | 7/1993 | Shimizu et al. | 257/347 |
| 5,382,816 | 1/1995 | Mitsui | 257/302 |
| 5,561,308 | 10/1996 | Kamata et al. | 257/329 |

FOREIGN PATENT DOCUMENTS

| | | |
|---|---|---|
| 59-204280 | 11/1984 | Japan . |
| 1-293666 | 11/1989 | Japan . |
| 2-52469 | 2/1990 | Japan . |

*Primary Examiner*—Tom Thomas
*Assistant Examiner*—David B. Hardy
*Attorney, Agent, or Firm*—Oblon, Spivak, McClelland, Maier & Neustadt, P.C.

[57] ABSTRACT

Semiconductor regions (2, 12) includes pillar-like projections (3, 13) extending vertically from major surfaces of the semiconductor regions and each having a vertical outer surface and an inner surface opposite to the outer surface. Vertical MOS transistors includes gate electrodes (4, 14) opposed to the outer surfaces of the pillar-like projections (3, 13) with gate insulating films (5, 15) interposed therebetween, with their bottom surfaces opposed to the major surfaces of the semiconductor regions (2, 12) with the gate insulating films (5, 15) interposed therebetween, source regions (6, 16) formed in upper end portions of the pillar-like projections (3, 13), drain regions (7, 17) formed in the major surfaces of the semiconductor regions (2, 12) so as to partly overlap bottom surfaces of the gate electrodes (4, 14), and back gate electrodes (8, 18) opposed to the inner surfaces of the pillar-like projections (3, 13) with back gate insulating films (9, 19) interposed therebetween. In the semiconductor device as above constructed, the MOS transistor can be supplied with a desired potential to avoid a punch through.

16 Claims, 21 Drawing Sheets

VERTICAL MOSFET INCLUDING A BACK GATE ELECTRODE

BACKGROUND OF THE INVENTION

1. Field of the Invention

The present invention relates to a semiconductor device featuring a MOS transistor, and more particularly to a semiconductor device which features a new vertical MOS transistor having a back gate electrode.

2. Description of the Background Art

As an exemplary one to achieve a variety of advantages, such as being unaffected by a latch up between adjacent MOS transistors opposite to each other in conductivity type, a semiconductor device with the MOS transistors formed individually on island-shaped thin silicon layers disposed on an insulating layer has been recently proposed.

FIG. 30 is a cross-sectional view briefly showing this kind of semiconductor device, i.e., an SOI/MOS transistor formed by the MESA isolation method. In this figure, a semiconductor substrate 30 is provided with a buried insulating layer 31 at a prescribed depth from its surface, and an island-shaped silicon layer is formed for each MOS transistor on an upper surface of the buried insulating layer 31 (this figure only shows a P-type silicon layer 32 formed by ion implantation with a P-type impurity for formation of an N-type MOS transistor and an N-type silicon layer 33 formed by ion implantation with an N-type impurity for formation of a P-type MOS transistor).

A gate electrode 34 of the N-type MOS transistor is formed on a surface of the P-type silicon layer 32, interposing a gate insulating film 35 which is formed of a silicon oxide film therebetween, and an N-type source region 36 and an N-type drain region 37 of the N-type MOS transistor are so formed as to sandwich a channel region which is positioned immediately beneath the gate electrode 34 in the P-type silicon layer 32, with their bottom surfaces in contact with the upper surface of the buried insulating layer 31. A gate electrode 38 of the P-type MOS transistor is formed on a surface of the N-type silicon layer 33, interposing a gate insulating film 39 which is formed of a silicon oxide film therebetween, and a P-type source region 40 and a P-type drain region 41 of the P-type MOS transistor are so formed as to sandwich a channel region which is positioned immediately beneath the gate electrode 38 in the N-type silicon layer 33, with their bottom surfaces in contact with the upper surface of the buried insulating layer 31.

An interlayer insulating film 42 is formed on the surface of the semiconductor substrate 30, inclusive of on the N-type MOS transistor and the P-type MOS transistor. A source electrode 43 of the N-type MOS transistor is physically and electrically connected to the source region 36 of the N-type MOS transistor through a contact hole 42a in the interlayer insulating film 42, and a drain electrode 44 of the N-type MOS transistor is physically and electrically connected to the drain region 37 of the N-type MOS transistor through a contact hole 42b in the interlayer insulating film 42.

A source electrode 45 of the P-type MOS transistor is physically and electrically connected to the source region 40 of the P-type MOS transistor through a contact hole 42c in the interlayer insulating film 42, and a drain electrode 46 of the P-type MOS transistor is physically and electrically connected to the drain region 41 of the P-type MOS transistor through a contact hole 42d in the interlayer insulating film 42.

In the semiconductor device as above constructed, the N-type MOS transistor and the P-type MOS transistor can not be individually supplied with a substrate potential, and therefore a short channel causes such a disadvantage as discussed below.

When a bottom surface of the semiconductor substrate 30 is supplied with a ground potential fixedly, if a positive potential is applied to the source region 40 of the P-type MOS transistor, a potential difference arises between the source region 40 and the semiconductor layer 30 under the buried insulating layer 31 and positive charges are collected into a portion of the bottom surface of the N-type silicon layer 33 in contact with the buried insulating layer 31 positioned between the source region 40 and the drain region 41 to raise a potential of that portion. That is apt to cause a punch through between the source region 40 and the drain region 41, and with size reduction, increases a possibility of drawing a current between the source region 40 and the drain region 41.

A solution to the above disadvantage of the P-type MOS transistor is to supply the bottom surface of the semiconductor substrate 30 with the same potential as the positive potential which is applied to the source region 40 of the P-type MOS transistor. When the bottom surface of the semiconductor substrate 30 is supplied with the positive potential fixedly, however, if the ground potential is applied to the source region 36 of the N-type MOS transistor, a potential difference arises between the source region 36 and the semiconductor layer 30 under the buried insulating layer 31 and negative charges are collected into a portion of the bottom surface of the P-type silicon layer 32 in contact with the buried insulating layer 31 positioned between the source region 36 and the drain region 37. That is apt to cause a punch through between the source region 36 and the drain region 37, and with size reduction, increases a possibility of drawing a current between the source region 36 and the drain region 37.

A solution to the above disadvantage of the N-type MOS transistor is to supply the bottom surface of the semiconductor substrate 30 with the same potential as the ground potential which is applied to the source region 36 of the N-type MOS transistor.

SUMMARY OF THE INVENTION

The present invention is directed to a semiconductor device. According to the first aspect of the present invention, the semiconductor device comprises (a) a first semiconductor region including (a-1) a major surface; and (a-2) a pillar-like portion extending vertically from the major surface, having (a-2-1) an outer surface perpendicular to the major surface; and (a-2-2) an inner surface opposite to the outer surface; (b) a first gate electrode including (b-1) a side surface opposed to the outer surface of the first semiconductor region with a first gate insulating film interposed therebetween; and (b-2) a bottom surface opposed to the major surface of the first semiconductor region with the first gate insulating film interposed therebetween; (c) a first source region formed in an upper end portion of the pillar-like portion of the first semiconductor region; (d) a first drain region formed in the major surface of the first semiconductor region, having a portion overlapping the bottom surface of the first gate electrode with the first gate insulating film interposed therebetween; and (e) a first back gate electrode opposed to the inner surface of the first semiconductor region with a first back gate insulating film interposed therebetween.

In the semiconductor device of the first aspect, a vertical MOS transistor requiring only small area is formed to thereby achieve high integration. Moreover, the first back gate electrode is independently supplied with a potential, and therefore, a stable operation can be achieved with strong punch-through resistance. Furthermore, the construction of the semiconductor device allows easy electrical connection between the first source region and the first back gate electrode.

According to the second aspect of the present invention, preferably in the semiconductor device of the first aspect, the first drain region includes (d-1) a low-concentration region having the portion overlapping the bottom surface of the first gate electrode; and (d-2) a high-concentration region formed so as to have a distance from the first back gate electrode longer than that of the low-concentration region and an impurity concentration higher than that of the low-concentration region.

In accordance with the second aspect, an effect of relieving an electric field at an end portion of the first drain region is achieved, as well as the effect of the first aspect.

In the semiconductor device of the first aspect of the present invention, two vertical MOS transistors can be formed. Specifically, the semiconductor device of the first aspect further comprises (f) a second semiconductor region including (f-1) a major surface; and (f-2) a pillar-like portion extending vertically from the major surface of the second semiconductor region, having (f-2-1) an outer surface perpendicular to the major surface of the second semiconductor region; and (f-2-2) an inner surface opposite to the outer surface of the second semiconductor region; (g) a second gate electrode including (g-i) a side surface opposed to the outer surface of the second semiconductor region with a second gate insulating film interposed therebetween; and (g-2) a bottom surface opposed to the major surface of the second semiconductor region with the second gate insulating film interposed therebetween; (h) a second source region formed in an upper end portion of the pillar-like portion of the second semiconductor region; (i) a second drain region formed in the major surface of the second semiconductor region, having a portion overlapping the bottom surface of the second gate electrode with the second gate insulating film interposed therebetween; and (j) a second back gate electrode opposed to the inner surface of the second semiconductor region with a second back gate insulating film interposed therebetween.

According to the third aspect of the present invention, preferably in the semiconductor device of the first aspect with two vertical MOS transistors, a first thickness between the Outer surface of the first semiconductor region and the inner surface of the first semiconductor region and a second thickness between the outer surface of the second semiconductor region and the inner surface of the semiconductor region are different from each other.

The semiconductor device of the third aspect allows the vertical MOS transistors which are different in threshold voltage to be easily formed.

According to the fourth aspect of the present invention, preferably the semiconductor device of the first aspect with two vertical MOS transistors further comprises (k) a first source electrode connecting electrically the first source region with the first back gate electrode; and (l) a second source electrode connecting electrically the second source region with the second back gate electrode. Also preferably, the semiconductor device of the first aspect with two vertical MOS transistors further comprises (m) an output electrode connecting electrically the first drain region with the second drain region. In this semiconductor device, the first semiconductor region and the second semiconductor region are different in conductivity type. Still preferably, the semiconductor device of the first aspect with two vertical MOS transistors further comprises (n) an input electrode connecting electrically the first gate electrode with the second gate electrode. In this semiconductor device, a signal received by the input electrode is logically inverted and outputted to the output electrode.

In accordance with the fourth aspect, making a good use of the advantage of the first aspect, an inverter circuit with an excellent characteristic can be consequently achieved.

According to the fifth aspect of the present invention, preferably the semiconductor device of the first aspect further comprises (f) a substrate having an insulating surface in which the first semiconductor region is formed and with which the first drain region comes into contact.

In accordance with the fifth aspect, an effect of reducing parasitic capacitance in the first drain region is achieved, as well as the effect of the first aspect. Surely, the preferable aspects can be achieved in the semiconductor device of the fifth aspect, just as the second to fourth aspects are achieved in the semiconductor device of the first aspect.

The present invention is also directed to a method of manufacturing a semiconductor device. According to the sixth aspect of the present invention, the method comprises the step of (a) forming a first semiconductor region including (a-1) a major surface; and (a-2) a pillar-like portion extending vertically from the major surface, having (a-2-1) an outer surface perpendicular to said major surface; and (a-2-2) an inner surface opposite to the outer surface; (b) forming a first gate insulating film on the outer surface of the first semiconductor region, and forming a first back gate insulating film on the inner surface of the first semiconductor region; (c) forming conductors on the first gate insulating film and the first back gate film; (d) etching the conductors to form (d-1) a first gate electrode including (d-1-1) a first side surface opposed to the outer surface of the first semiconductor region with the first gate insulating film interposed therebetween; and (d-1-2) a bottom surface opposed to the major surface of the first semiconductor region with the first gate insulating film interposed therebetween; and (d-2) a first back gate electrode opposed to the inner surface of the first semiconductor region with the first back gate insulating film interposed therebetween; and (e) forming a first source region in an upper end portion of the pillar-like portion of the first semiconductor region, and forming a first drain region in the major surface of the first semiconductor region so as to have a portion overlapping the bottom surface of the first gate electrode with the first gate insulating film interposed therebetween.

Using the method of the sixth aspect, a vertical MOS transistor requiring only small area and having the first back gate electrode which is independently supplied with a potential can be easily formed.

According to the seventh aspect of the present invention, preferably in the sixth aspect, the method further comprises the steps of (f) forming a second semiconductor region including (f-1) a major surface; and (f-2) a pillar-like portion extending vertically from the major surface of the second semiconductor region, having (f-2-1) an outer surface perpendicular to the major surface of the second semiconductor region; and (f-2-2) an inner surface opposite to the outer surface of the second semiconductor region; (g) forming a second gate insulating film on the outer surface of the second semiconductor region, and forming a second back gate insulating film on the inner surface of the second semiconductor region; and (h) forming a second source region in an upper end portion of the pillar-like portion of the second semiconductor region, and forming a second drain region in the major surface of the second semiconductor region so as to have a portion overlapping the bottom surface of the second gate electrode with the second gate insulating film interposed therebetween. The steps (f) and (g) are performed concurrently with the steps (a) and (b), respectively. The conductors are also formed on the second gate insulating film and the second back gate film in the step (c). Further in the step (d), formed are (d-3) a second gate electrode including (d-3-1) a side surface opposed to the outer surface of the second semiconductor region with the second gate insulating film interposed therebetween; and (d-3-2) a bottom surface opposed to the major surface of the second semiconductor region with the second gate insulating film interposed therebetween; and (d-4) a second back gate electrode opposed to the inner surface of the second semiconductor region with the second back gate insulating film interposed therebetween. The semiconductor device is formed using the method of the seventh aspect so that a first thickness between the outer surface of the first semiconductor region and the inner surface of the first semiconductor region and a Second thickness between the outer surface of the second semiconductor region and the inner surface of the semiconductor region may be different from each other.

Using the method of the seventh aspect produces an effect of easy formation of the vertical MOS transistors which are different in threshold voltage without increasing any step, as well as the effect of the sixth aspect.

According to the eighth aspect of the present invention, preferably in the method of the sixth aspect, the step (e) includes the steps of (e-1) forming a low-concentration region having the portion overlapping the bottom surface of the first gate electrode; and (e-2) forming a high-concentration region so as to have a distance from the first back gate electrode longer than that of the low-concentration region and an impurity concentration higher than that of the low-concentration region, to enhance an impurity concentration of the first source region.

Using the method of the eighth aspect produces an effect of easy formation of the vertical MOS transistor in which the parasitic resistance in the first source region is reduced and the electric field at the end portion of the first drain region is relieved, as well as the effect of the sixth aspect.

An object of the present invention is to provide a semiconductor device having a MOS transistor which is supplied with a desired substrate potential to avoid a punch through, for example, by providing the back gate electrode so as to be given the same potential as the source region is given, and further to provide a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
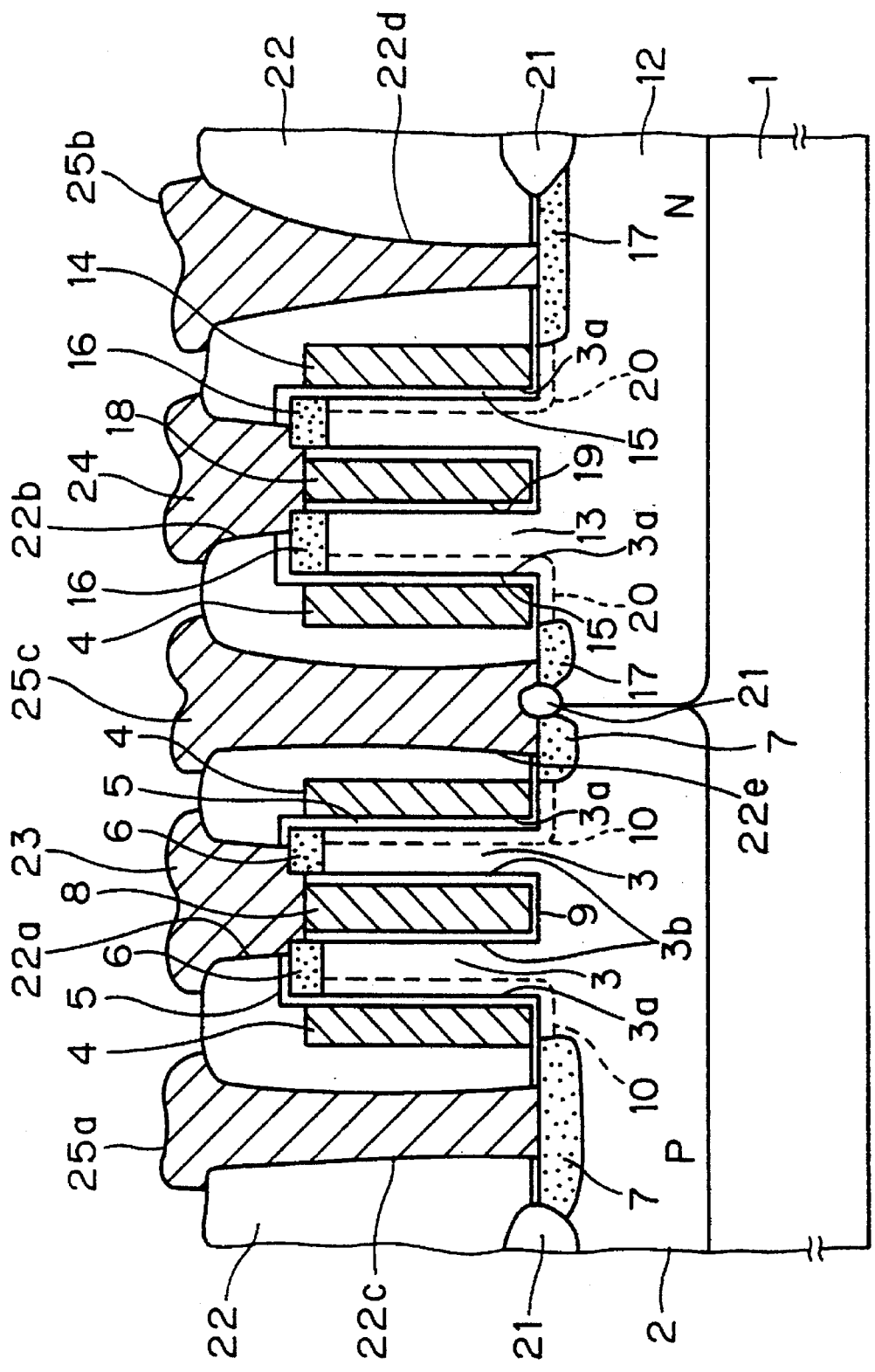
FIG. 1 is a cross-sectional view taken along the line I—I of FIG. 2 showing a first preferred embodiment of the present invention.

FIGS. 1 to 4 illustrates the first preferred embodiment. In FIGS. 1 to. 3, a semiconductor substrate 1 is formed of a P-type silicon substrate, and a P-type well region 2 is formed of a P-type semiconductor region as the first semiconductor region provided in a surface of the semiconductor substrate 1, having a major surface and a pillar-like portion 3 projecting uprightly from its major surface with a vertical outer peripheral surface 3a as an outside face and an inner peripheral surface 3b as an inside face positioned in an opposite side to the outside face. This P-type well region 2 is formed by ion implantation with boron (B) at a dose ranging from $1\times10^{12}/cm^2$ to $3\times10^{12}/cm^2$ and at an energy ranging from 50 keV to 100 keV, having almost uniform concentration of $1\times10^{17}/cm^3$ in a direction of depth from an upper end surface of the pillar-like projection 3. The pillar-like projection 3 has a height ranging from 0.3 µm to 1 µm (specifically, 0.5 µm) and a thickness ranging from 600 Å to 1200 Å (specifically, 1000 Å).

A gate electrode 4 of a vertical N-type MOS transistor (referred to as "NMOS" hereinafter) is opposed to the outer peripheral surface 3a of the pillar-like projection 3 of the P-type well region 2, interposing a gate insulating film 5 which is formed Of a silicon oxide film with a thickness ranging from 60 Å to 100 Å therebetween, and its bottom surface is opposed to the major surface of the P-type well region 2 with the gate insulating film 5 interposed therebetween. This gate electrode 4 has a tubular electrode portion 4a surrounding the pillar-like projection 3 and wiring portions 4b and 4c extending from the electrode portion 4a, and is formed of polysilicon having a phosphorus concentration of $4\times10^{19}/cm^3$ or more so that an upper end surface of the electrode portion 4a may be lower than the upper end surface of the pillar-like projection 3 by 500 Å to 8000 Å.

An N-type source region 6 of the NMOS is formed in the upper end portion of the pillar-like projection 3 of the P-type well region 2 by ion implantation with arsenic (As) at a dose ranging from $4\times10^{35}/cm^2$ to $6\times10^{15}/cm^2$ at an energy of 40 keV, having a diffused layer depth ranging from 1000 Å to 2000 Å from the upper end surface of the pillar-like projection 3 and a concentration ranging from $2\times10^{20}/cm^3$ to $6\times10^{20}/cm^3$.

An N-type drain region 7 of the NMOS is formed in an upper surface of the P-type well region 2 so as to partly overlap a bottom surface of the electrode portion 4a of the gate electrode 4, having a diffused layer depth ranging from 1000 Å to 2000 Å from the upper surface of the P-type well region 2 and a concentration ranging from $2\times10^{20}/cm^3$ to $6\times10^{20}/cm^3$.

A back gate electrode 8 of the NMOS is opposed to the inner peripheral surface 3b of the pillar-like projection 3 of the P-type well region 2, interposing a back gate insulating film 9 which is formed of a silicon oxide film with a thickness ranging from 60 Å to 100 Å therebetween, and buried in a region surrounded by the pillar-like projections 3. This back gate electrode 8 is formed of polysilicon having a phosphorus concentration of $4\times10^{19}/cm^3$ or more so that its upper end surface may be lower than the upper end surface of the pillar-like projection 3 by 500 Å to 8000 Å. A channel region 10 of the NMOS is formed in a surface layer of the outer peripheral surface 3a between the source region 6 and the drain region 7.

An N-type well region 12 is formed of an N-type semiconductor region as the second semiconductor region provided in a surface of the semiconductor substrate 1, having a major surface and a pillar-like portion 13 projecting uprightly from the major surface with a vertical outer peripheral surface 13a as an outside face and an inner peripheral surface 13b as an inside face positioned in an opposite side to the outside face. This N-type well region is formed by ion implantation with phosphorus (P) at a dose ranging from $1\times10^{12}/cm^2$ to $3\times10^{22}/cm^2$ at an energy ranging from 50 keV to 100 keV, having almost uniform concentration of $1\times10^{16}/cm^3$ in a direction of depth from an upper end surface of the pillar-like projection 13. The pillar-like projection 13 has a height ranging from 0.3 µm to 1 µm (specifically, 0.5 µm) and a thickness ranging from 800 Å to 1200 Å (specifically, 1000 Å).

A gate electrode 14 of a vertical P-type MOS transistor (referred to as "PMOS" hereinafter) is opposed to the outer peripheral surface 13a of the pillar-like projection 13 of the N-type well region 12, interposing a gate insulating film 15 which is form&d of a silicon oxide film with a thickness ranging from 60 Å to 100 Å therebetween, and its bottom surface is opposed to the major surface of the N-type well region 12 with the gate insulating film 15 interposed therebetween. This gate electrode 14 has a tubular electrode portion 14a surrounding the pillar-like projection 13 and wiring portions 14b and 14c extending from the electrode portion 14a, and is formed of polysilicon having a phosphorus concentration of $4\times10^{19}/cm^3$ or more so that an upper end surface of the electrode portion 14a may be lower than the upper end surface of the pillar-like projection 13 by 500 Å to 8000 Å.

A P-type source region 16 of the PMOS is formed in the upper end portion of the pillar-like projection 13 of the N-type well region 12 by ion implantation with boron (B) at a dose ranging $4\times10^{15}/cm^2$ to $6\times10^{15}/cm^2$ at an energy of 20 keV, having a diffused layer depth ranging from 2000 Å to 4000 Å from the upper end surface of the pillar-like projection 13 and a concentration ranging from $1.5\times10^{20}/cm^3$ to $3\times10^{20}/cm^3$.

A P-type drain region 17 of the PMOS is formed in an upper surface of the N-type well region 12 so as to partly overlap the electrode portion 14a of the gate electrode 14, having a diffused layer depth ranging from 2000 Å to 4000 Å from the upper surface of the N-type well region 12 and a concentration ranging from $1.5\times10^{20}/cm^3$ to $3\times10^{20}/cm^3$.

A back gate electrode 18 of the PMOS is opposed to the inner peripheral surface 13b of the pillar-like projection 13 of the N-type well region 12, interposing a back gate insulating film 19 which is formed of a silicon oxide film with a thickness ranging from 60 Å to 100 Å therebetween, and buried in a region surrounded by the pillar-like projections 13. This back gate electrode 18 is formed of polysilicon having a phosphorus concentration of $4\times10^{19}/cm^3$ or more so that its upper end surface may be lower than the upper end surface of the pillar-like projection 13 by 500 Å to 8000 Å.

A channel region 20 of the PMOS is formed in a surface layer of the outer peripheral surface 13a between the source region 16 and the drain region 17. An isolation insulating film 21 is formed of a silicon oxide film provided in the surface of the semiconductor substrate 1 so as to surround the NMOS and the PMOS separately, that is, in the major surfaces of the P-type well region 2 and the N-type well region 12, to electrically isolate the NMOS and the PMOS from each other.

A interlayer insulating film 22 is formed on the surface of the semiconductor substrate 1, inclusive of on the NMOS and the PMOS. A first source electrode 23 is connected physically and electrically to the source region 6 and the back gate electrode 8 of the NMOS through a contact hole 22a formed over the upper end surface of the back gate electrode 8 and part of the upper end surface of the pillar-like projection 3 on its side close to the back gate electrode 8. A second source electrode 24 is connected physically and electrically to the source region 16 and the back gate electrode 18 of the PMOS through a contact hole 22b formed over the upper end surface of the back gate electrode 18 and part of the upper end surface of the pillar-like projection 13 on its side close to the back gate electrode 18.

The second source electrode 24 is further connected to a first supply potential node which is supplied with a first potential $V_{DD}$, e.g., a supply potential of 3 V in the first preferred embodiment, by means of an interconnection layer which extends on the interlayer insulating film 22. The first source electrode 23 is further connected to a second supply potential node which is supplied with a second potential lower than the first potential, e.g., a ground potential in the first preferred embodiment, by means of the interconnection layer which extends on the interlayer insulating film 22. The first and second source electrodes 23 and 24 are formed of a metal layer made of aluminum or aluminum alloy mainly composed of aluminum.

A common drain electrode 25 makes an electric connection between the drain region 7 of the NMOS and the drain region 17 of the PMOS. This common drain electrode 25 has a first drain electrode 25a connected physically and electrically to the drain region 7 through a contact hole 22c formed in the interlayer insulating film 22 positioned over the drain region 7, a second drain electrode 25b connected physically and electrically to the drain region 17 through a contact hole 22d formed in the interlayer insulating film 22 positioned over the drain region 17, and a third drain electrode 25c connected physically and electrically to the drain regions 7 and 17 through a contact hole 22e formed in the interlayer insulating film 22 positioned over the drain regions 7 and 17, which serves as an output node of an inverter circuit which consists of the NMOS drain region 7 and the PMOS drain region 17. The common drain electrode 25 is formed of a metal layer made of aluminum or aluminum alloy mainly composed of aluminum.

The first source electrode 23, the second source electrode 24, and the common drain electrode 25 may be formed in a same step.

A common gate electrode 26 makes an electric connection between the gate electrode 4 of the NMOS and the gate electrode 14 of the PMOS, serving as an input node of the inverter circuit. This common gate electrode 26 is connected to physically and electrically to the wiring portion 4b of the gate electrode 4 through a contact hole 22f formed in the interlayer insulating film 22 positioned over the wiring portion 4b and connected to the wiring portion 14b of the gate electrode 14 through a contact hole 22g formed in the interlayer insulating film 22 positioned over the wiring portion 14b, and it is formed of a metal layer made of aluminum or aluminum alloy mainly composed of aluminum, extending on the interlayer insulating layer 22.

Figure 4:
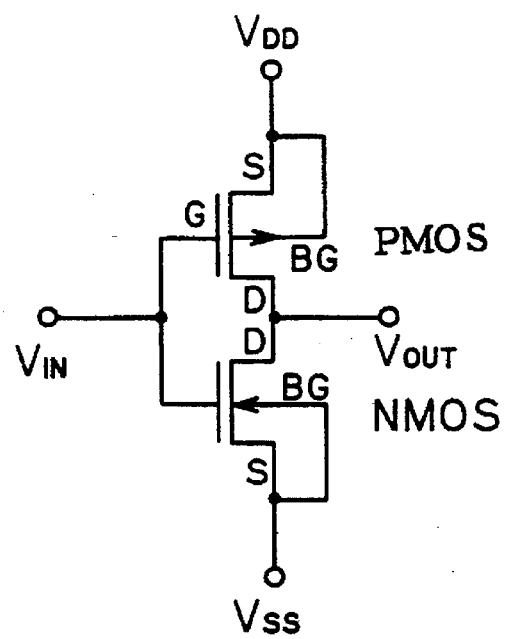
FIG. 4 is a circuit diagram of an inverter circuit as an application of the present invention.

The NMOS and the PMOS constructed as above constitute an inverter circuit of FIG. 4. Specifically, in the PMOS, the source region S (16) and the back gate electrode BG (18) are connected in common to the first supply potential $V_{DD}$ node, the drain region D (17) is connected to the output node $V_{OUT}$ and the gate electrode G (14) is connected to the input node $V_{IN}$.

In the NMOS, the source region S (6) and the back gate electrode BG (8) are connected in common to the second supply potential $V_{SS}$ node, the drain region D (7) is connected to the output node $V_{OUT}$ in common with the drain region D (17) of the PMOS and the gate electrode G (4) is connected to the input node $V_{IN}$ in common with the gate electrode G (14) of the PMOS.

Now, referring to FIGS. 5 to 13, a method of manufacturing the semiconductor device constructed as above will be discussed.

At the outset, a region for the N-type well to be formed in the surface of the semiconductor substrate 1 is masked by a resist and a region for the P-type well to be formed is ion-implanted with boron (B) at a dose ranging from $1 \times 10^{12}/cm^2$ to $3 \times 10^{12}/cm^2$ at an energy ranging from 50 keV to 100 keV, to form the P-type well region. At this time, the P-type well region has almost uniform boron-concentration of $1 \times 10^{17}/cm^3$ in the direction of depth from its surface.

Next, the P-type well region is masked by the resist and the region for the N-type well region to be formed in the semiconductor substrate 1 is ion-implanted with phosphorus (P) at a dose ranging from $1 \times 10^{12}/cm^2$ to $3 \times 10^{12}/cm^2$ at an energy ranging from 50 keV to 100 keV, to form the N-type well region. At this time, the N-type well region has almost uniform phosphorus-concentration of $1 \times 10^{16}/cm^3$ in the direction of depth from its surface.

Figure 5:
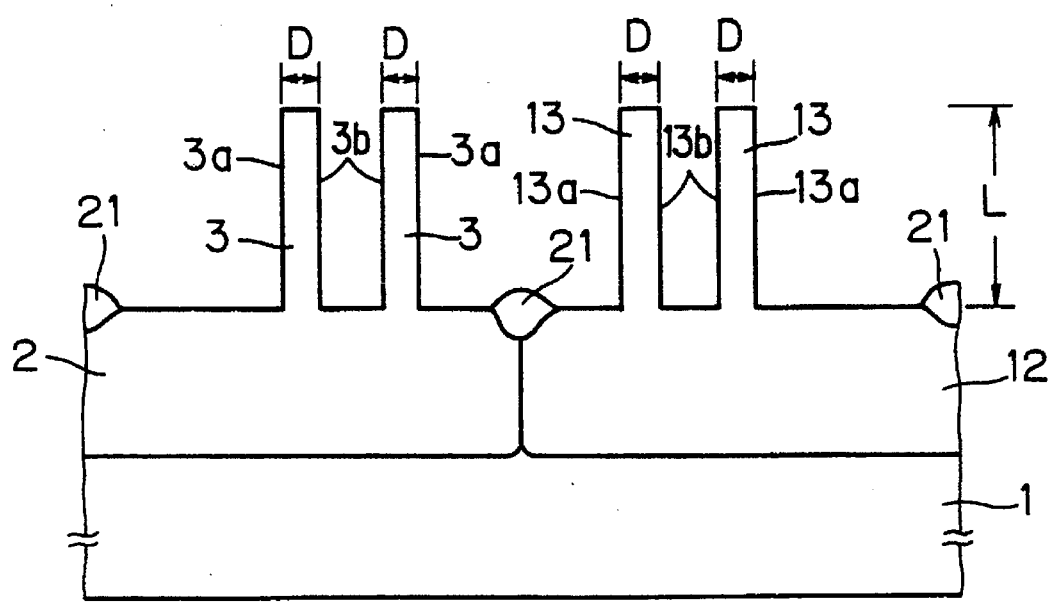
FIG. 5 is a cross-sectional view taken along the line V—V of FIG. 6 showing a step in a manufacturing method in accordance with the first preferred embodiment of the present invention.
Figure 6:
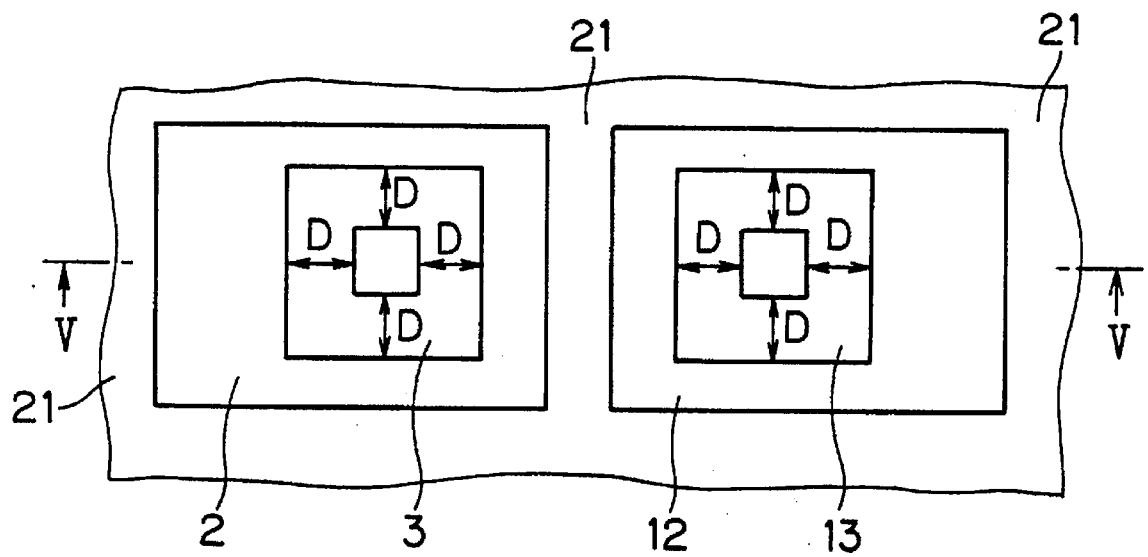
FIG. 6 is a plan view of the step in the manufacturing method in accordance with the first preferred embodiment of the present invention.

To form the NMOS and the PMOS, a prescribed region of the P-type well region (a region for the pillar-like projection 3 to be formed in the first preferred embodiment) and a prescribed region of the N-type well region (a region for the pillar-like projection 13 to be in the first preferred embodiment) are masked by the resist and are subjected to a dry etching antisotropically, to form the P-type well region 2 having the pillar-like projection 3 and the N-type well region 12 having the pillar-like projection 13, as shown in FIGS. 5 and 6.

The etching is performed so that the etching depth may be determined in accordance with the design rules of the NMOS and the PMOS. For example, in manufacturing the semiconductor device under a 0.5 µm rule, the etching depth, i.e., the height L of the pillar-like projections 3 and 13 is 0.5 µm, where the thickness D of the pillar-like projections 3 and 13 is determined to be 1000 Å.

The height L of the pillar-like projections 3 and 13 is not restricted as above, but may ranges from 0.3 µm to 1 µm. The thickness D thereof is not restricted as above, either, but may ranges from 600 Å to 1200 Å depending on the threshold voltage.

The isolation insulating film 21 which is a silicon oxide film to electrically isolate the NMOS and the PMOS from each other is formed of by a commonly-known LOCOS method so that its thickness may ranges from 2000 Å to 6000 Å. This isolation insulating film 21 is also necessarily formed at the interface between the P-type well region 2 and the N-type well region 12.

Furthermore, a $P^+$ semiconductor region having an impurity concentration higher than that of the P-type well region 2 may be formed as a channel stopper immediately beneath the isolation insulating film 21 in the P-type well region 2.

Figure 7:
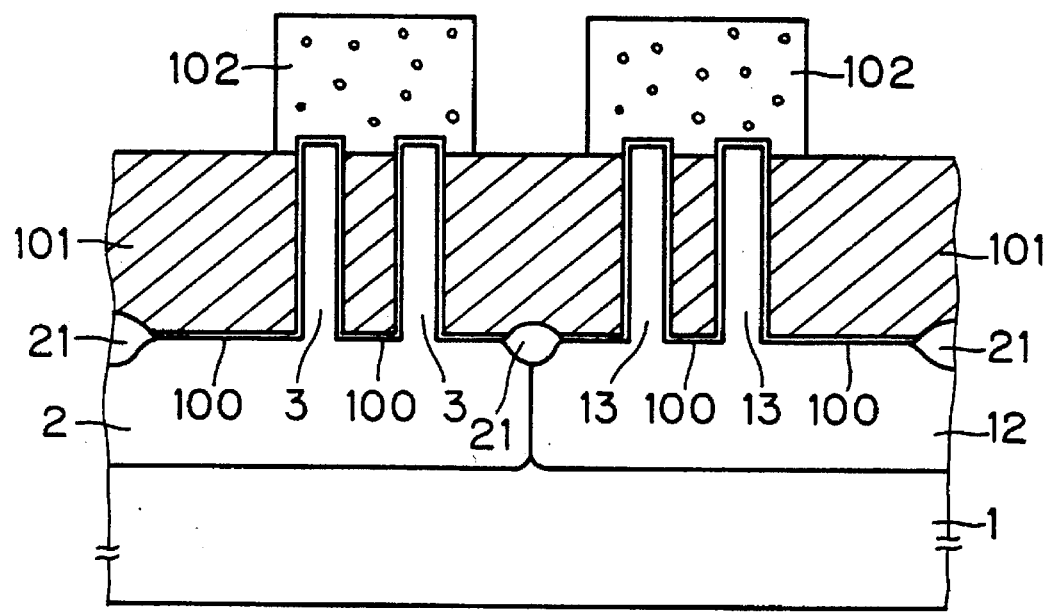
FIG. 7 is a cross-sectional view of a step following the step of FIG. 6 in the manufacturing method in accordance with the first preferred embodiment of the present invention.

In a subsequent step to form the gate insulating film 5 and the back gate insulating film 9, as shown in FIG. 7, the upper surface of the semiconductor substrate 1, i.e., the major surface of the P-type well region 2 including the pillar-like projection 3 and the major surface of the N-type well region 12 including the pillar-like projection 13 are thermally oxidized, to form a silicon oxide film 100 with a thickness ranging from 60 Å to 100 Å.

To form the gate electrode 4 and the back gate electrode 8 of the NMOS and the gate electrode 14 and the back gate electrode 18 of the PMOS, a polysilicon layer 101 having a phosphorus-concentration of $4 \times 10^{19}/cm^3$ or more is deposited on the upper surface of the semiconductor substrate 1, i.e., on the silicon oxide film 100 and the isolation insulating film 21 as far as it reaches a position lower than the upper end surface of the pillar-like projections 3 and 13 by 500 Å to 8000 Å.

The polysilicon layer 101 is formed by a CVD method with polysilicon made by thermal decomposition of $SiH_4$-$H_2$ in the $PH_3$-mixed atmosphere, where the formation temperature ranges 600° C. to 900° C. and the growth rate is controlled to be 20 Å/ min. The film-thickness uniformity is ±5 Å in a wafer surface.

A resist layer is formed over the whole surface of the polysilicon layer 101 and etched to leave regions in polysilicon layer 101 for the gate electrode 4 and the back gate electrode 8 of the NMOS and the gate electrode 14 and the back gate electrode 18 of the PMOS to be formed, and thus a patterned resist layer 102 is formed.

Figure 8:
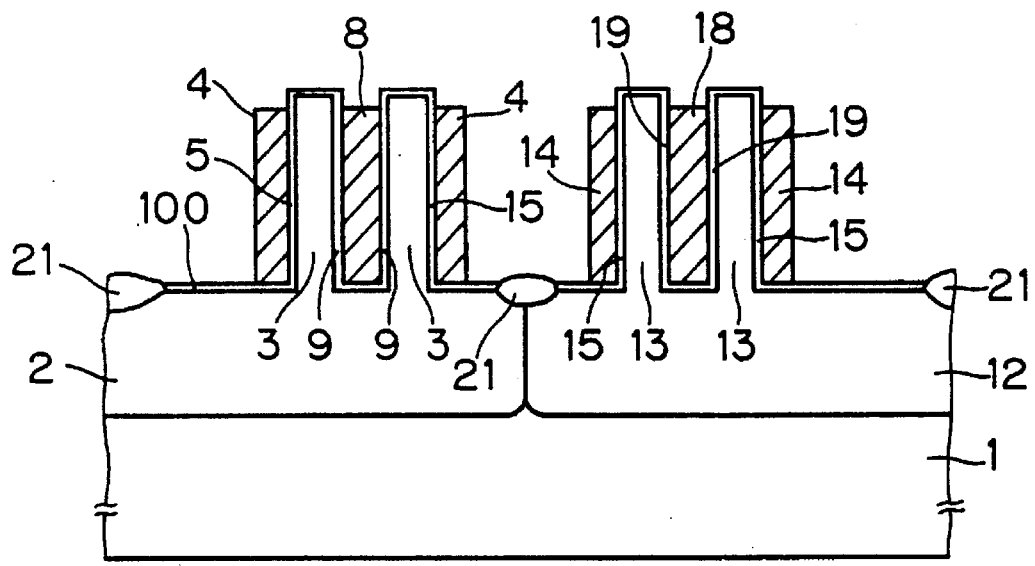
FIG. 8 is a cross-sectional view taken along the line VIII—VIII of FIG. 9 showing a step following the step of FIG. 7 in the manufacturing method in accordance with the first preferred embodiment of the present invention.
Figure 9:
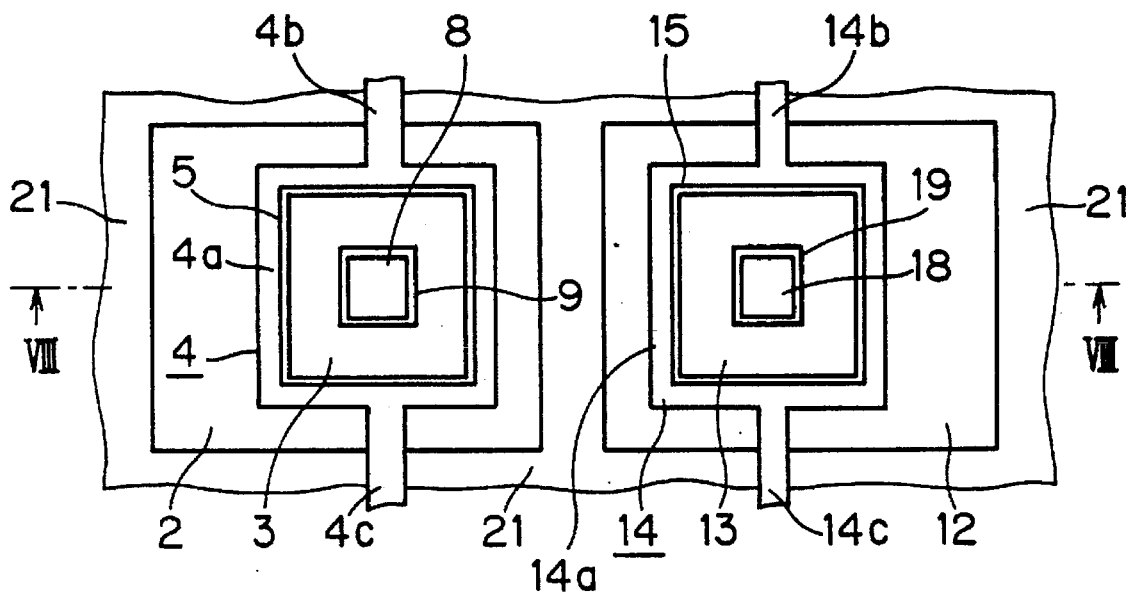
FIG. 9 is a plan view of the step following the step of FIG. 7 in the manufacturing method in accordance with the first preferred embodiment of the present invention.

Using the patterned resist layer 102 as a mask, as shown in FIGS. 8 and 9, the polysilicon layer 101 is etched to form the gate electrode 4 and the back gate electrode 8 of the NMOS and the gate electrode 14 and the back gate electrode 18 of the PMOS.

The polysilicon layer 101 is subjected to a reactive etching in the atmosphere of mixed gas composed of $CCl_4$, $Cl_2$, He and the like.

Figure 10:
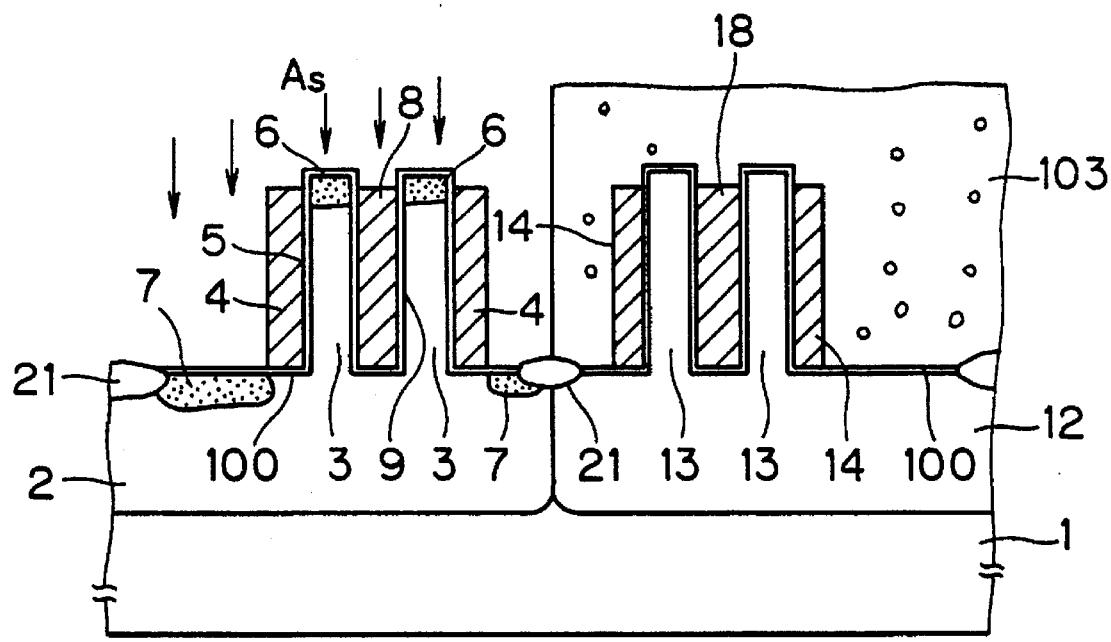
FIG. 10 is a cross-sectional view of a step following the step of FIG. 9 in the manufacturing method in accordance with the first preferred embodiment of the present invention.

Subsequently, as shown in FIG. 10, a resist layer is formed on the surface of the semiconductor substrate 1 and etched to expose a region for the NMOS to be formed, and thus a patterned resist layer 103 is formed.

Using the patterned resist layer 103 as a mask, ion implantation is performed with arsenic at a dose ranging from $4 \times 10^{15}$/cm$^2$ to $6 \times 10^{15}$/cm$^2$ at an energy of 40 keV.

As the result, in a self-aligned manner with a function of the gate electrode 4 and back gate electrode 8 as a mask, the N-type source region 6 of the NMOS is formed in the upper end surface of pillar-like projection 3, having a diffused layer depth ranging from 1000 Å to 2000 Å and a concentration ranging from $2 \times 10^{20}$/cm$^3$ to $6 \times 10^{20}$/cm$^3$. It is preferable that the source region 6 may be formed so as to partly overlap the gate electrode 4 and the back gate electrode 8.

Moreover, in a self-aligned manner with a function of the gate electrode 4 and isolation insulating film 21 as a mask, the N-type drain region 7 of the NMOS is formed in the major surface of the P-type well region 2 positioned between the gate electrode 4 and the isolation insulating film 21, having a diffused layer depth ranging from 1000 Å to 2000 Å and a concentration ranging from $2 \times 10^{20}$/cm$^3$ to $6 \times 10^{20}$/cm$^3$. The drain region 7 partly overlaps the gate electrode 4.

Thus, the vertical N-MOS transistor is formed, having the gate electrode 4 opposed to the outer peripheral surface 3a of the pillar-like projection 3 of the P-type well region 2 with the gate insulating film 5 interposed therebetween, with its bottom surface opposed to the major surface of the P-type well region 2 with the gate insulating film 5 interposed therebetween, the source region 6 provided in the upper end surface of the pillar-like projection 3, the drain region 7 provided in the major surface of the P-type well region 2, partly overlapping the bottom surface of the gate electrode 4, and the back gate electrode 8 opposed to the inner peripheral surface 3b of the pillar-like projection. 3 with the back gate insulating film 9 interposed therebetween.

Figure 11:
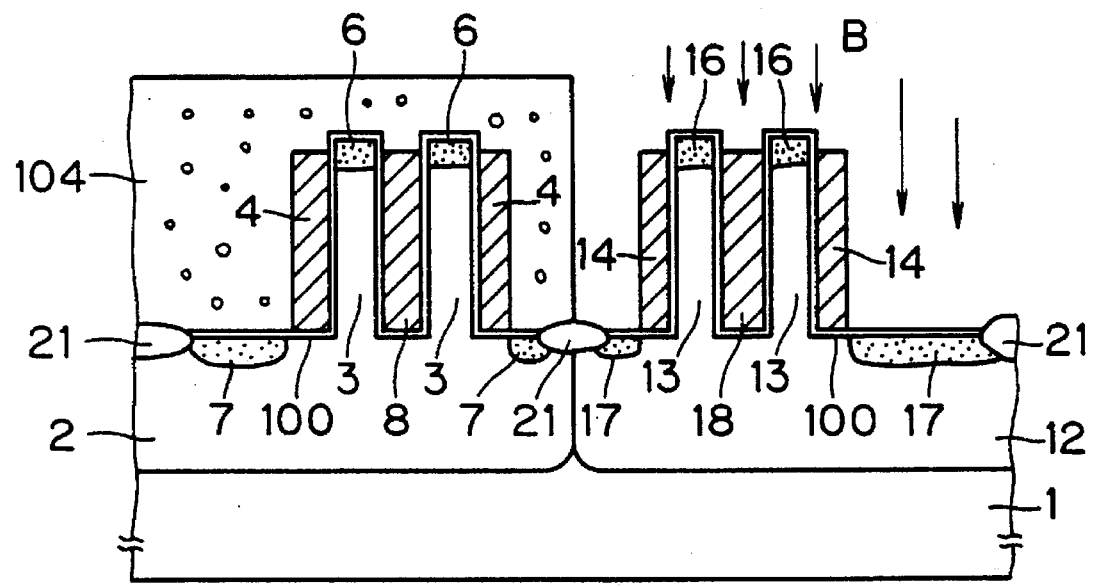
FIG. 11 is a cross-sectional view of a step following the step of FIG. 10 in the manufacturing method in accordance with the first preferred embodiment of the present invention.

After removing the resist layer 103, a resist layer is formed on the surface of the semiconductor substrate 1 and etched to expose a region for the PMOS to be formed, and thus a patterned resist layer 104 is formed, as shown in FIG. 11.

Using the patterned resist layer 104 as a mask, ion implantation is performed with boron at a dose ranging from $4 \times 10^{15}$/cm$^2$ to $6 \times 10^{15}$/cm$^2$ at an energy of 20 keV.

As the result, in a self-aligned manner with a function of the gate electrode 14 and back gate electrode 18 as a mask, the P-type source region 16 of the PMOS is formed in the upper end surface of pillar-like projection 3, having a diffused layer depth ranging from 2000 Å to 4000 Å and a concentration ranging from $1.5 \times 10^{20}$/cm$^3$ to $3 \times 10^{20}$/cm$^3$ to $3 \times 10^{20}$/cm$^3$. It is preferable that the source region 16 may be formed so as to partly overlap the gate electrode 14 and the back gate electrode 18.

Moreover, in a self-aligned manner with a function of the gate electrode 14 and isolation insulating film 21 as a mask, the P-type drain region 17 of the PMOS is formed in the major surface of the N-type well region 12 positioned between the gate electrode 14 and the isolation insulating film 21, having a diffused layer depth ranging from 2000 Å to 4000 Å and a concentration ranging from $1.5 \times 10^{20}$/cm$^3$ to $3 \times 10^{20}$/cm$^3$. The drain region 17 partly overlaps the gate electrode 14.

Thus, the vertical P-MOS transistor is formed, having the gate electrode 14 opposed to the outer peripheral surface 13a of the pillar-like projection 13 of the N-type well region 12 with the gate insulating film 15 interposed therebetween, with its bottom surface opposed to the major surface of the N-type well region 12 with the gate insulating film 15 interposed therebetween, the source region 16 provided in the upper end surface of the pillar-like projection 13, the drain region 17 provided in the major surface of the N-type well region 12, partly overlapping the bottom surface of the gate electrode 14, and the back gate electrode 18 opposed to the inner peripheral surface 13b of the pillar-like projection 13 with the back gate insulating film 19 interposed therebetween.

Figure 12:
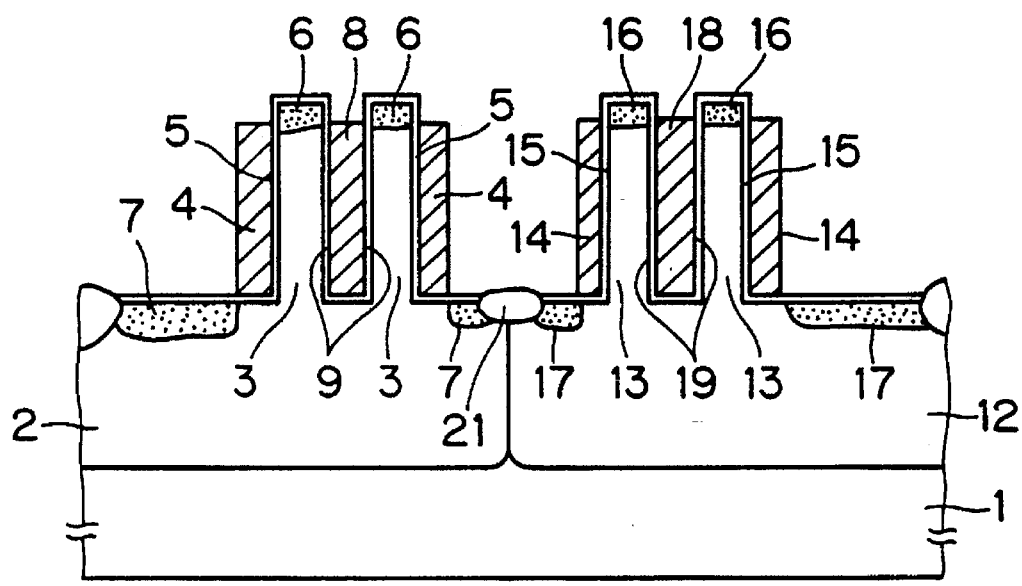
FIG. 12 is a cross-sectional view taken along the line XII—XII of FIG. 13 showing a step following the step of FIG. 11 in the manufacturing method in accordance with the first preferred embodiment of the present invention.
Figure 13:
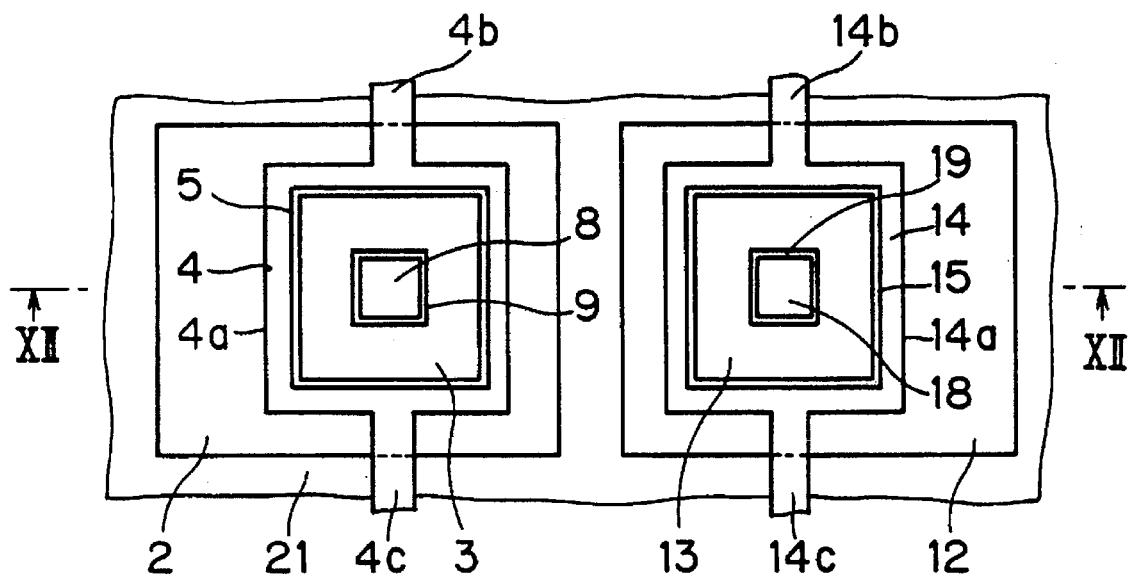
FIG. 13 is a plan view of the step following the step of FIG. 11 in the manufacturing method in accordance with the first preferred embodiment of the present invention.

After removing the resist layer 104, the semiconductor device structure of FIGS. 12 and 13 is achieved.

The interlayer insulating film 22 is thereafter formed over the whole surface of the semiconductor substrate 1. In the interlayer insulating film 22, the contact hole 22a over the upper end surface of the back gate electrode 8 and part of the upper end surface of the pillar-like projection 3 on its side close to the back gate electrode 8, the contact hole 22b over the upper end surface of the back gate electrode 18 and part of the upper end surface of the pillar-like projection 13 on its side close to the back gate electrode 18, the contact hole 22c over the drain region 7, the contact hole 22d over the drain region 17, the contact hole 22e over the drain region 7 and the drain region 17, the contact hole 22f over the wiring portion 4b of the gate electrode 4 and the contact hole 22g over the wiring portion 14b of the gate electrode 14 are formed by a commonly-known photolithographic technique.

Subsequently, the metal layer made of e.g., aluminum or aluminum alloy mainly composed of aluminum is vapor-deposited by sputtering over the whole interlayer insulating film 22 including the contact holes 22a to 22g.

Figure 2:
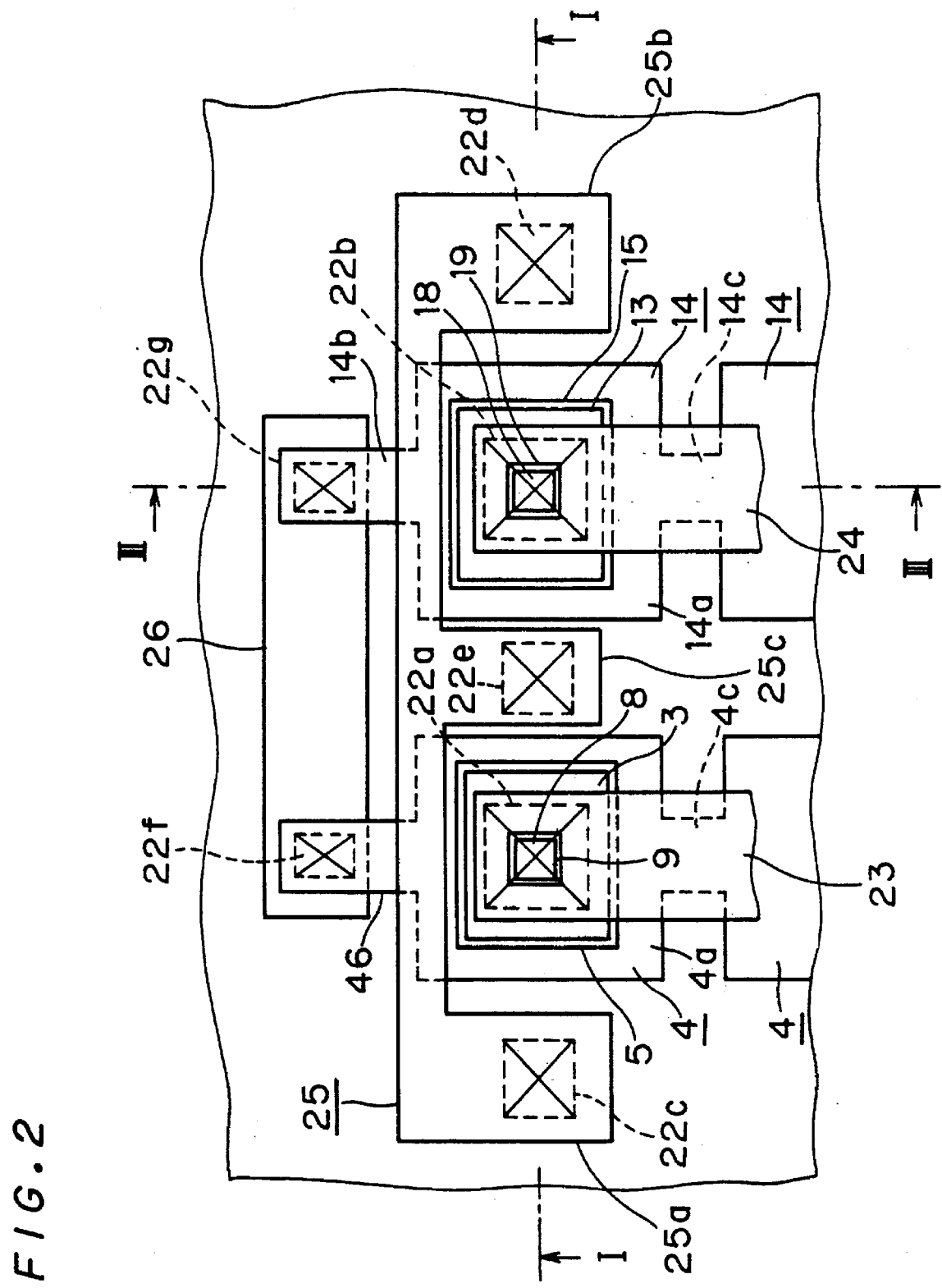
FIG. 2 is a plan view of the first preferred embodiment of the present invention.
Figure 3:
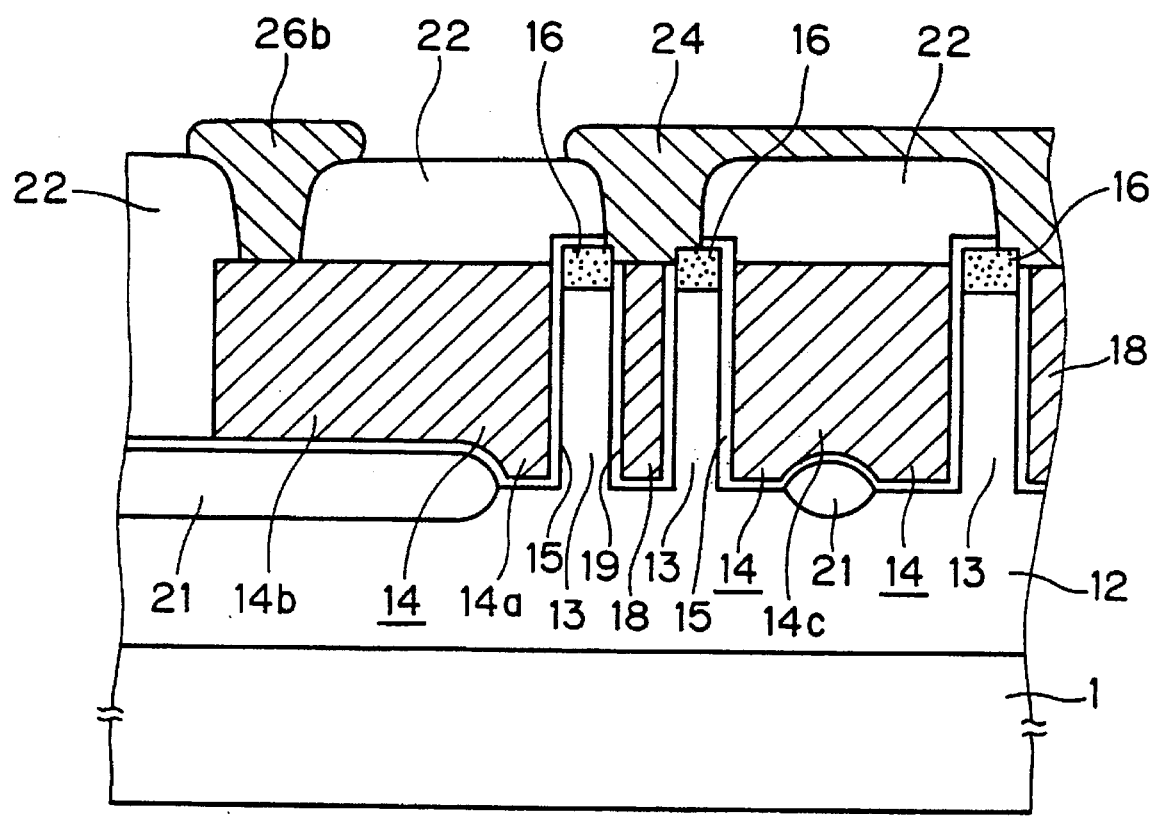
FIG. 3 is a cross-sectional view taken along the line III—III of FIG. 2 showing the first preferred embodiment of the present invention.

Patterning the metal layer by the commonly-known photolithographic technique forms the first source electrode 23 to be connected physically and electrically to the source region 6 and the back gate electrode 8 through the contact hole 22a and to be connected to the second supply potential node through the interconnection layer which is formed integrally therewith and extends on the interlayer insulating film 22, the second source electrode 24 to be connected physically and electrically to the source region 16 and the back gate electrode 18 through the contact hole 22b and to be connected to the first supply potential node through the interconnection layer which is formed integrally therewith and extends on the interlayer insulating film 22, the first drain electrode 25a to be connected physically and electrically to the drain region 7 through the contact hole 22c, the second drain electrode 25b to be connected physically and electrically to the drain region 17 through the contact hole 22d, the third drain electrode 25c to be connected physically and electrically to the drain regions 7 and 17 through the contact hole 22e, the connection portion 25d formed integrally with the drain electrodes 25a to 25c on the interlayer insulating film 22 and the common gate electrode 26 to be connected physically and electrically to the wiring portion 4b of the gate electrode 4 through the contact hole 22f and to be connected physically and electrically to the wiring portion 14b of the gate electrode 14 through the contact hole 22g. Thus, the semiconductor device of FIGS. 1 and 2 is achieved.

In the semiconductor device constructed as above, when the NMOS is formed on the P-type well region 2 having a concentration of $1 \times 10^{17}/cm^3$ and the pillar-like projection 3 has a thickness of 1000 Å, the NMOS operates with a threshold voltage of 0.6 V, being partially depleted, achieves a high drain breakdown voltage and effectively draws excessive carriers from the channel 10. Furthermore, since the back gate electrode 8 is supplied with the same potential as the source region 6 is supplied, i.e, the grounded potential, the NMOS ensures stability of its operation.

On the other hand, when the PMOS is formed on the N-type well region 12 having a concentration of $1 \times 10^{16}/cm^3$ and the pillar-like projection 13 has a thickness of 1000 Å, the PMOS operates with a threshold voltage of 0.9 V in absolute value, being fully depleted. Furthermore, since the back gate electrode 18 is supplied with the same potential as the source region 16 is supplied, i.e, the power supply potential in the first preferred embodiment, a potential difference in the inner peripheral surface 13b of the pillar-like projection 13 through the back gate insulating film 19 effectively becomes 0 V, to thereby achieve a strong punch-through resistance and an excellent short channel effect leading to a stable operation.

Moreover, the NMOS and the PMOS which are both vertically constructed require only small areas in the semiconductor substrate 1 and are suitable for high integration.

Alternatively the pillar-like projections 3 and 13 may be different in height, though they have the same height L in the first preferred embodiment, and accordingly transistors with a variety of gate lengths (depending on the height of pillar-like projection) may be formed on the semiconductor substrate 1.

That can be easily achieved only by changing the etching mask used in forming the pillar-like projections for transistor formation.

<The Second Preferred Embodiment>

Although the semiconductor device of the first preferred embodiment includes the pillar-like projections 3 and 13 of the same thickness, the pillar-like projections 3 and 13 may be different in thickness to achieve a variety of threshold voltages.

Transistors with a variety of threshold voltages, of which the pillar-like projections are different from each other in thickness, can be easily achieved only by changing the etching mask used in forming the pillar-like projections 3 and 13 for transistor formation in the first preferred embodiment. In this case, variation of threshold voltage is achieved without changing the concentration in the channel regions, resulting in a simplified process. That is, since the channel regions 10 and 20 in the NMOS and the PMOS have the same impurity concentration, the well regions 2 and 12 each require only one ion-implantation mask for their formation.

Furthermore the pillar-like projections 3 and 13 also require only one etching mask to form MOSs with different threshold voltages.

Figure 14:
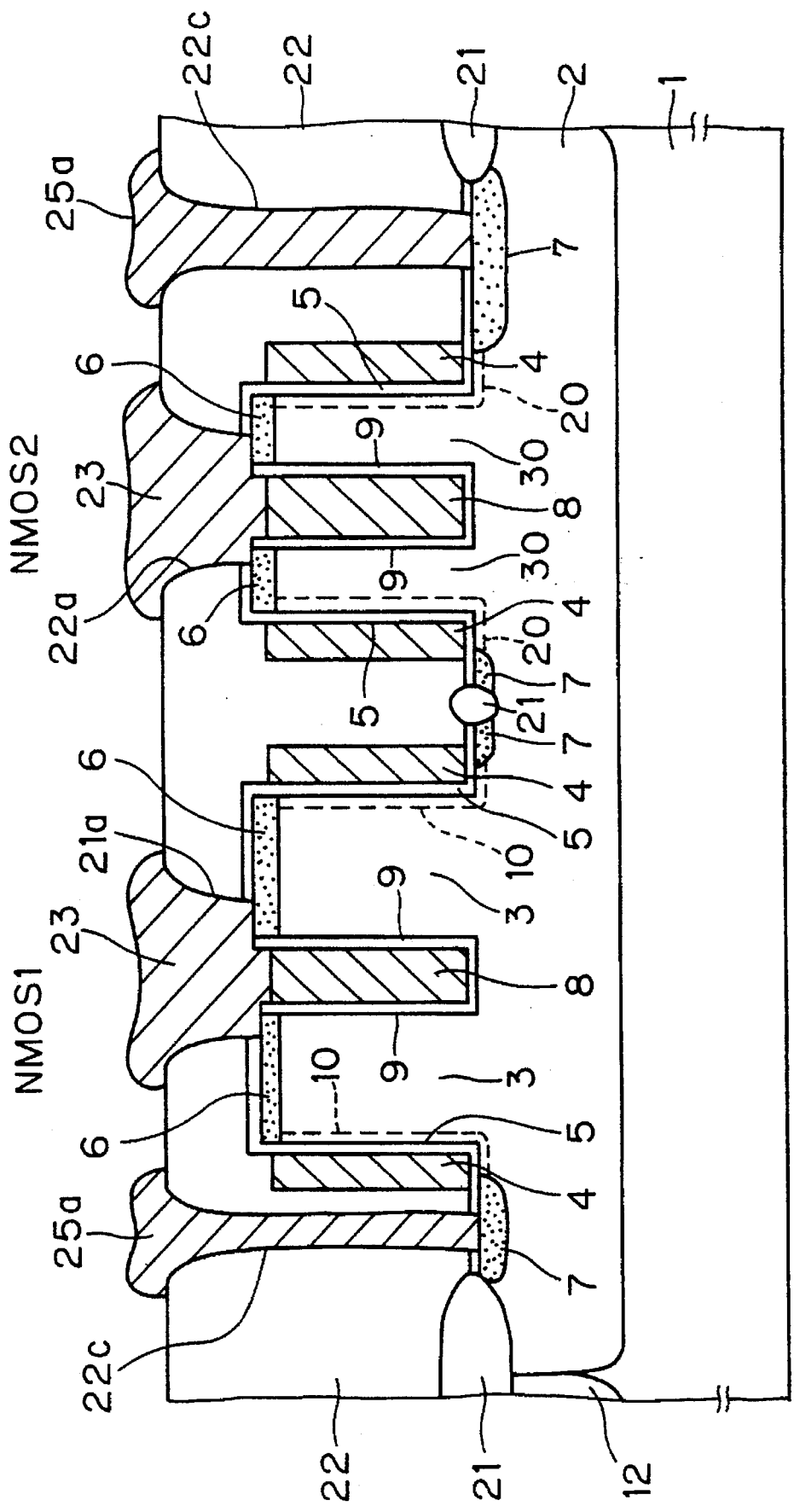
FIG. 14 is a cross-sectional view taken along the line XIV—XIV of FIG. 15 showing a second preferred embodiment of the present invention.
Figure 15:
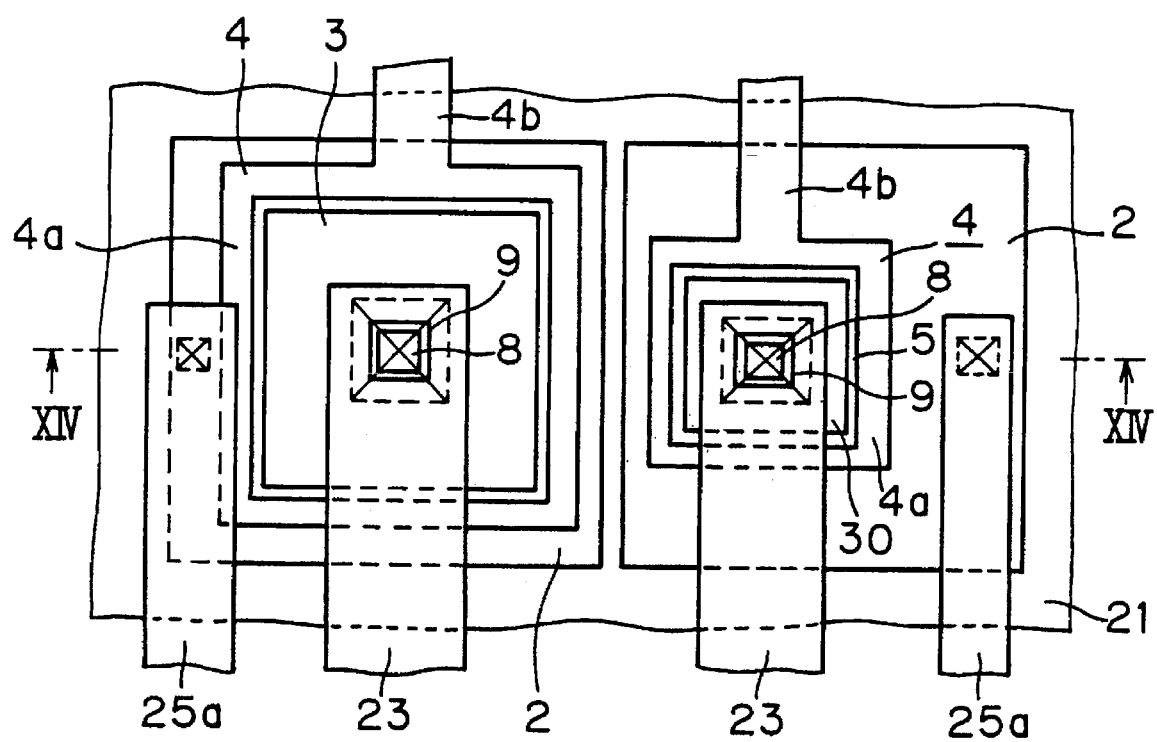
FIG. 15 is a plan view of the second preferred embodiment of the present invention.

FIGS. 14 and 15 are a cross-sectional view and a plan view, respectively, illustrating the second preferred embodiment. Two NMOSs which are different from each other in threshold voltage are shown. The NMOS 1 shown in the left of the figures includes the pillar-like projection 3 having a thickness of 1000 Å and obtains a threshold voltage of 0.6 V, and the NMOS 2 shown in the right of the figures includes the pillar-like projection 30 having a thickness of 600 Å and obtains a threshold voltage of 0.3 V.

Thus, a variety of threshold voltages can be achieved only by changing thicknesses of the pillar-like projections.

For example, The NMOS including the pillar-like projection 3 with a concentration of $1 \times 10^{17}/cm^3$ and a thickness ranging from 600 Å to 1200 Å obtains a threshold voltage ranging from 0.3 V to 0.8 V, and the PMOS including the pillar-like projection 13 with a concentration of $1 \times 10^{16}/cm^3$ and a thickness ranging from 600 Å to 1200 Å obtains a threshold voltage ranging from 0.6 V to 1.1 V.

In FIGS. 14 and 15, the same reference numerals and characters as those of FIGS. 1 and 2 represent the same or like elements.

Alternatively, as is clear from the above discussion, the pillar-like projections 3 and 13 of the NMOS and the PMOS may be different form each other in thickness to achieve the NMOS and the PMOS which are different from each other in threshold value, although two NMOSs which are different in threshold voltage are shown in FIGS. 14 and 15.

<The Third Preferred Embodiment>

FIGS. 16 to 20 illustrate the third preferred embodiment. The third preferred embodiment is different from the first preferred embodiment only in that the drain region 7 of the NMOS has an LDD (Lightly Doped Drain) structure and the drain region 17 of the PMOS also has the LDD structure. Other features are the same as those of the first preferred embodiment.

Figure 16:
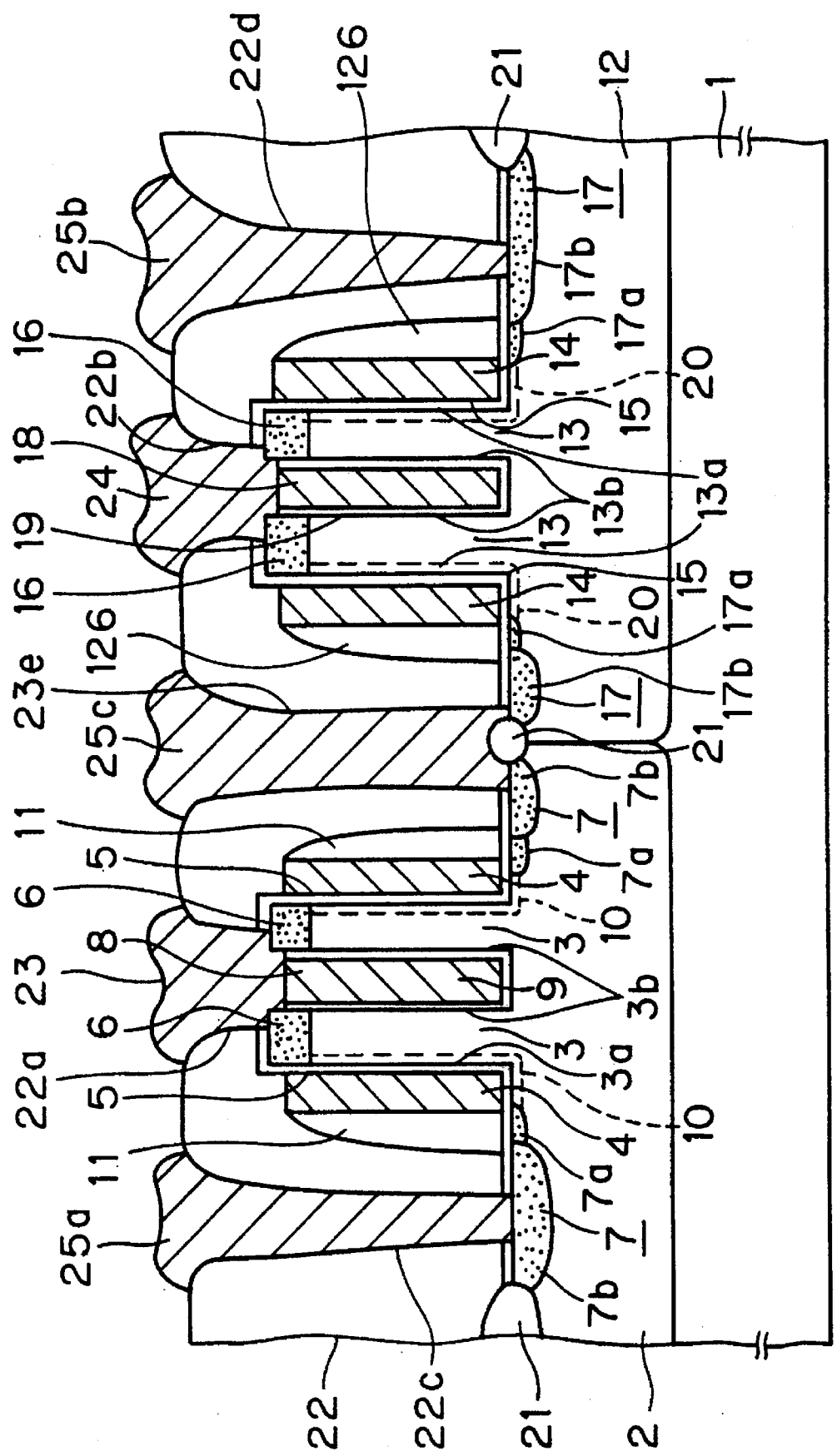
FIG. 16 is a cross-sectional view showing a third preferred embodiment of the present invention.

In FIG. 16, the same reference numerals and characters as those of FIG. 1 associated with the first preferred embodiment represent the same or like elements. The source region 6 is formed by ion implantation with phosphorus (P) at a dose ranging from $4 \times 10^{13}/cm^2$ to $6 \times 10^{13}/cm^2$ at an energy of 40 keV and further ion implantation with arsenic (As) at a dose ranging from $4 \times 10^{15}/cm^2$ to $6 \times 10^{15}/cm^2$ at an energy of 40 keV and has a concentration ranging from $2 \times 10^{20}/cm^3$ to $6 \times 10^{20}/cm^3$. A low-concentration impurity region 7a is formed by ion implantation with phosphorus (P) at a dose ranging from $4 \times 10^{13}/cm^2$ to $6 \times 10^{13}/cm^2$ at an energy of 40 keV and has a concentration ranging from $1 \times 10^{17}/cm^3$ to $6 \times 10^{17}/cm^3$, and a high-concentration impurity region 7b is formed by ion implantation with arsenic (As) at a dose ranging from $4 \times 10^{15}/cm^2$ to $6 \times 10^{15}/cm^2$ at an energy of 40 keV and has a concentration ranging from $2 \times 10^{20}/cm^3$ to $6 \times 10^{20}/cm^3$. These impurity regions 7a and 7b constitute the drain region 7 of the NMOS.

The source region 16 is formed by ion implantation with boron (B) at a dose ranging from $4 \times 10^{13}/cm^2$ to $6 \times 10^{13}/cm^2$ at an energy of 20 keV and again at a dose ranging from $4 \times 10^{35}/cm^2$ to $6 \times 10^{15}/cm^2$ at an energy of 20 keV and has a concentration ranging from $1.5 \times 10^{20}/cm^3$ to $3 \times 10^{20}/cm^3$. A low-concentration impurity region 17a is formed by ion implantation with boron (B) at a dose ranging from $4 \times 10^{13}/cm^2$ to $6 \times 10^{13}/cm^2$ at an energy of 20 keV and has a concentration ranging from $1.5 \times 10^{17}/cm^3$ to $3 \times 10^{17}/cm^3$, and a high-concentration impurity region 17b is formed by ion implantation with boron (B) at a dose ranging from $4\times10^{15}/cm^2$ to $6\times10^{15}/cm^2$ at an energy of 20 keV and has a concentration ranging from $1.5\times10^{20}/cm^3$ to $3\times10^{20}/cm^3$. These impurity regions 17a and 17b constitute the drain region 17 of the PMOS.

A side wall 11 is formed of a silicon oxide film provided along an outer peripheral surface of the gate electrode 4 of the NMOS and serves as a spacer, and a side wall 126 is formed of a silicon oxide film provided along an outer peripheral surface of the gate electrode 14 of the PMOS and also serves as a spacer.

Now, referring to FIGS. 17 to 20, a method of manufacturing the above constructed semiconductor device will be discussed.

First of all, through the steps shown in FIGS. 5 to 9 like in the first preferred embodiment, the P-type well region 2 having the pillar-like projection 3 and the N-type well region 12 having the pillar-like projection 13, the isolation insulating film 21, the gate electrode 4 and the back gate electrode 8 of the NMOS and the gate electrode 14 and the back gate electrode 18 of the PMOS are formed.

The polysilicon layer 101 is reactively etched in the atmosphere of mixed gas composed of $CCl_4$, $Cl_2$, He and the like.

Figure 17:
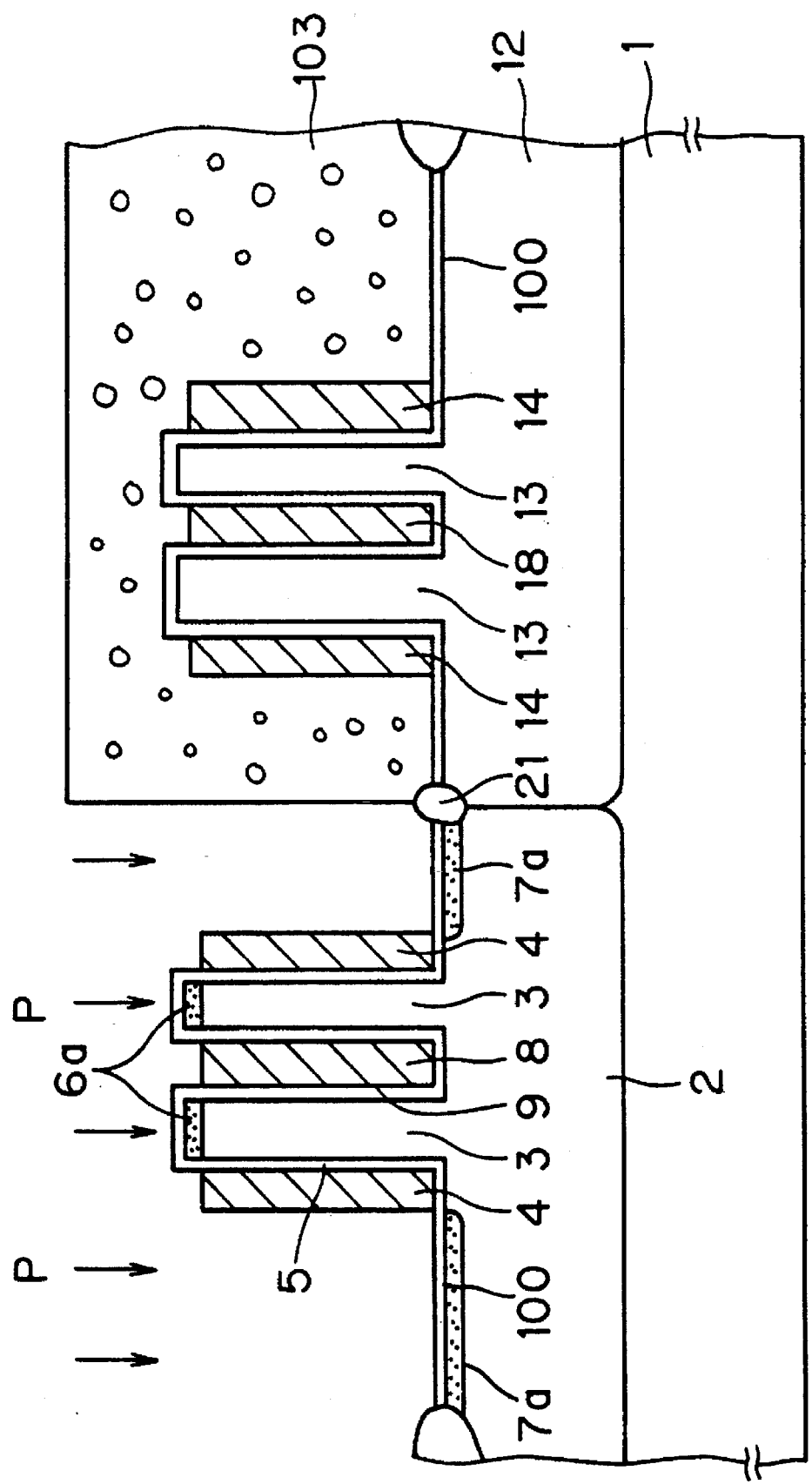
FIGS. 17 to 20 are cross-sectional views sequentially showing steps of a manufacturing method in accordance with the third preferred embodiment of the present invention.

Next, as shown in FIG. 17, a resist layer is formed on the upper surface of the semiconductor substrate 1 and etched to expose a region for the NMOS to be formed, and thus the patterned resist layer 103 is formed.

Using the patterned resist layer 103 as a mask, an ion implantation is performed with phosphorus at a dose ranging from $4\times10^{13}/cm^2$ to $6\times10^{13}/cm^2$ at an energy of 40 keV.

As the result, in a self-aligned manner with a function of the gate electrode 4 and back gate electrode 8 as a mask, a low-concentration impurity region 6a of the N-type source region 6 of the NMOS is formed in the upper end portion of the pillar-like projection 3, having a concentration ranging from $1\times10^{17}/cm^3$ to $6\times10^{17}/cm^3$.

Furthermore, in a self-aligned manner with a function of the gate electrode 4 and the isolation insulating film 21 as a mask, the low-concentration impurity region 7a of the N-type drain region 7 of the NMOS is formed in the major surface of the P-type well region 2 positioned between the gate electrode 4 and the isolation insulating film 21, having a concentration ranging from $1\times10^{17}/cm^3$ to $6\times10^{17}/cm^3$. The low-concentration impurity region 7a partly overlaps the gate electrode 4.

Figure 18:
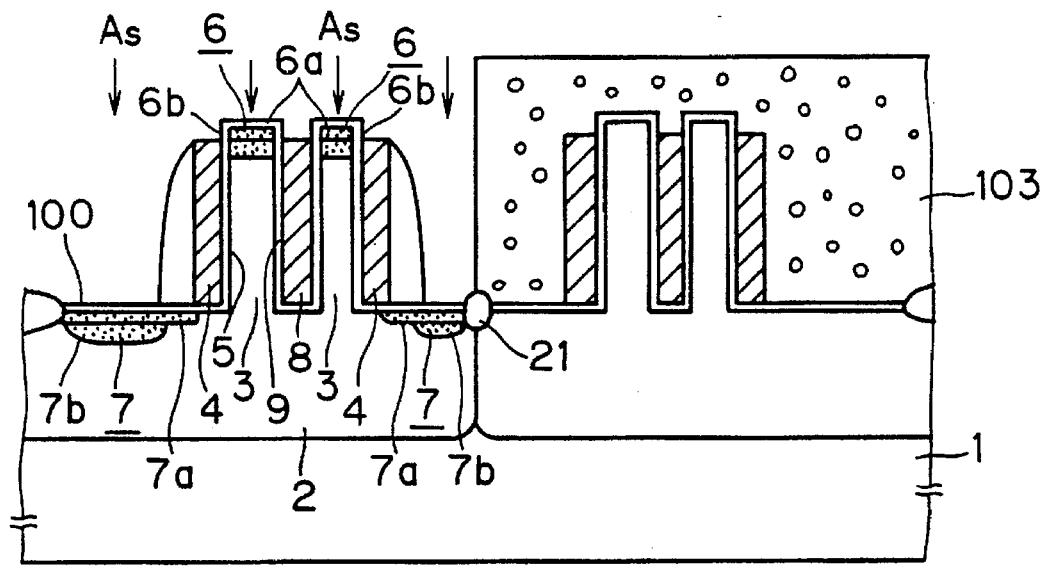

In a subsequent step, the side wall 11 is formed along the outer peripheral surface of the gate electrode 4, as shown in FIG. 18. In a state as shown in FIG. 17, a silicon oxide film having a thickness ranging from e.g., 500 Å to 1500 Å is formed over the whole surface of the semiconductor substrate 1 by a CVD method and then the silicon oxide film is etched by e.g., reactive ion etching in the atmosphere of strongly-anisotropic etching gas. Thus, the side wall 11 is formed along the outer peripheral surface of the gate electrode 4 in a self-aligned manner.

An ion implantation is thereafter performed with arsenic at a dose ranging from $4\times10^{15}/cm^2$ to $6\times10^{15}/cm^2$ at an energy of 40 keV.

As the result, in a self-aligned manner with a function of the gate electrode 4 and back gate electrode 8 as a mask, a high-concentration impurity region 6b of the N-type source region 6 of the NMOS is formed in the upper end portion of the pillar-like projection 3, having a concentration ranging from $2\times10^{20}/cm^3$ to $6\times10^{20}/cm^3$. In this step, the whole low-concentration impurity region 6a is subjected to the ion implantation for the high-concentration impurity region 6b and an amount of the implanted ion is larger by two orders of magnitude. Consequently, the source region 6 becomes a high-concentration impurity region with a concentration ranging from $2\times10^{20}/cm^3$ to $6\times10^{20}/cm^3$, not including the low-concentration impurity region.

Furthermore, in a self-aligned manner with a function of the side wall 11 and the isolation insulating film 21 as a mask, the high-concentration impurity region 7b of the N-type drain region 7 of the NMOS is formed in the major surface of the P-type well region 2 positioned between the side wall 11 and the isolation insulating film 21, having a concentration ranging from $2\times10^{20}/cm^3$ to $6\times10^{20}/cm^3$. Accordingly, the drain region 7 has the LDD structure including the low-concentration impurity region 7a which partly overlaps the bottom surface of the gate electrode 4 and the high-concentration impurity region 7b which does not overlap the same.

Thus, the vertical N-MOS transistor with the drain region 7 of the LDD structure is formed.

Figure 19:
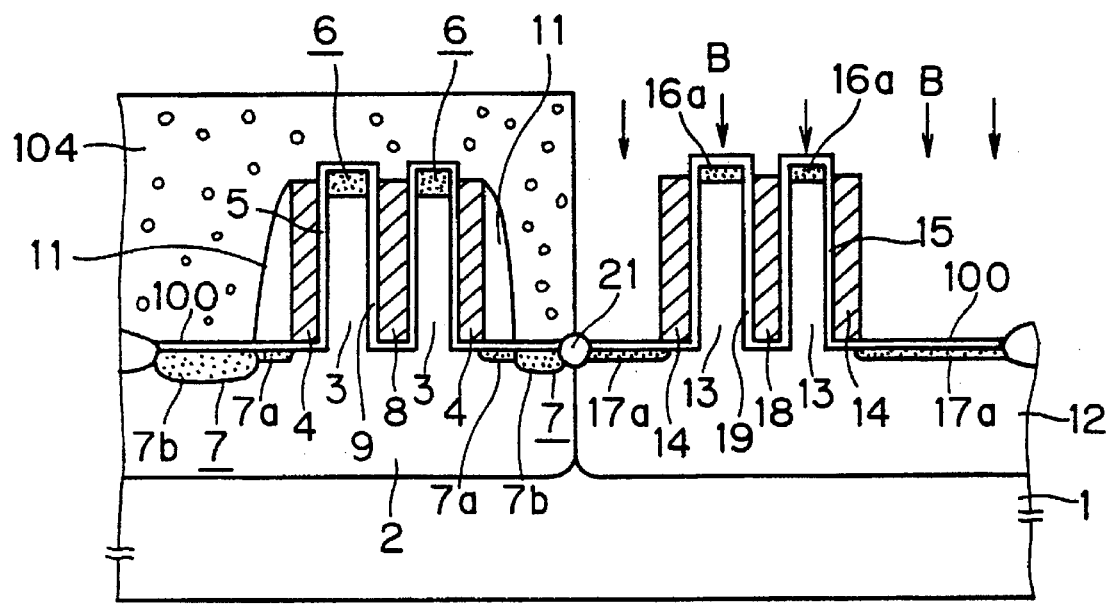

After removing the resist layer 103, as shown in FIG. 19, a resist layer is formed on the upper surface of the semiconductor substrate 1 and etched to expose a region for the PMOS to be formed, and thus the patterned resist layer 104 is formed.

Using the patterned resist layer 104 as a mask, an ion implantation is performed with boron at a dose ranging from $4\times10^{13}/cm^2$ to $6\times10^{13}/cm^2$ at an energy of 20 keV.

As the result, in a self-aligned manner with a function of the gate electrode 14 and back gate electrode 18 as a mask, a low-concentration impurity region 16a of the P-type source region 16 of the PMOS is formed in the upper end portion of the pillar-like projection 13, having a concentration ranging from $1.5\times10^{17}/cm^3$ to $3\times10^{17}/cm^3$.

Furthermore, in a self-aligned manner with a function of the gate electrode 14 and the isolation insulating film 21 as a mask, the low-concentration impurity region 17a of the P-type drain region 17 of the PMOS is formed in the major surface of the N-type well region 12 positioned between the gate electrode 14 and the isolation insulating film 21, having a concentration ranging from $1.5\times10^{17}/cm^3$ to $3\times10^{17}/cm^3$. The low-concentration impurity region 17a partly overlaps the gate electrode 14.

Figure 20:
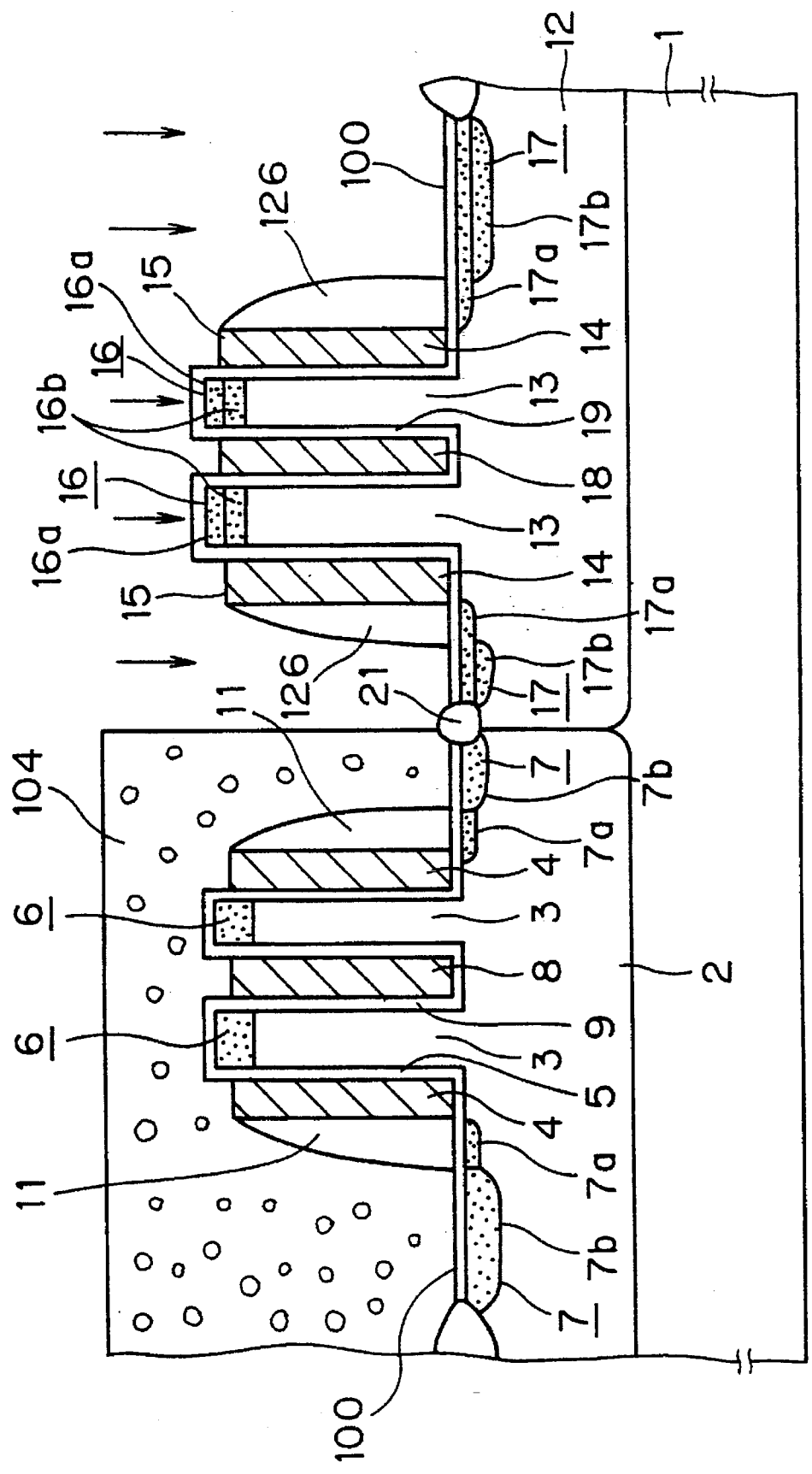

In a subsequent step, the side wall 126 is formed along an outer peripheral surface of the gate electrode 14, as shown in FIG. 20. In a state as shown in FIG. 19, a silicon oxide film having a thickness ranging from e.g., 500 Å to 1500 Å is formed over the whole surface of the semiconductor substrate 1 by a CVD method and then the silicon oxide film is etched by e.g., reactive ion etching in the atmosphere of strongly-anisotropic etching gas. Thus, the side wall 126 is formed along the outer peripheral surface of the gate electrode 14 in a self-aligned manner.

An ion implantation is thereafter performed with boron at a dose ranging from $4\times10^{15}/cm^2$ to $6\times10^{15}/cm^2$ at an energy of 20 keV.

As the result, in a self-aligned manner with a function of the gate electrode 14 and back gate electrode 18 as a mask, a high-concentration impurity region 16b of the P-type source region 16 of the PMOS is formed in an upper end portion of the pillar-like projection 13, having a concentration ranging from $1.5\times10^{20}/cm^3$ to $3\times10^{20}/cm^3$. In this step, the whole low-concentration impurity region 16a is subjected to the ion implantation for the high-concentration impurity region 16b and an amount of the implanted ion is larger by two orders of magnitude. Consequently, the source region 16 becomes a high-concentration impurity region with a concentration ranging from $1.5\times10^{20}/cm^3$ to $3\times10^{20}/cm^3$, not including the low-concentration impurity region.

Furthermore, in a self-aligned manner with a function of the side wall 126 and the isolation insulating film 21 as a mask, the high-concentration impurity region 17b of the P-type drain region 17 of the PMOS is formed in the major surface of the N-type well region 12 positioned between the side wall 126 and the isolation insulating film 21, having a concentration ranging from $1.5\times10^{20}/cm^3$ to $3\times10^{20}/cm^3$. Accordingly, the drain region 17 has the LDD structure including the low-concentration impurity region 17a which partly overlaps the bottom surface of the gate electrode 14 and the high-concentration impurity region 17b which does not overlap the same.

Thus, the vertical P-MOS transistor with the drain region 17 of the LDD structure is formed.

Thereafter, through the same steps as shown in FIGS. 12 and 13 like in the first preferred embodiment, the resist layer 104 is removed to form the interlayer insulating film 22. Furthermore, formed are the first source electrode 23 to be connected physically and electrically to the source region 6 and the back gate electrode 8 through the contact hole 22a and to be connected to the second supply potential node through the interconnection layer which is formed integrally therewith and extends on the interlayer insulating film 22, the second source electrode 24 to be connected physically and electrically to the source region 16 and the back gate electrode 18 through the contact hole 22b and to be connected to the first supply potential node through the interconnection layer which is formed integrally therewith and extends on the interlayer insulating film 22, the first drain electrode 25a to be connected physically and electrically to the drain region 7 through the contact hole 22c, the second drain electrode 25b to be connected physically and electrically to the drain region 17 through the contact hole 22d, the third drain electrode 25c to be connected physically and electrically to the drain regions 7 and 17 through the contact hole 22e, the connection portion 25d formed integrally with the drain regions 25a to 25c on the interlayer insulating film 22 and the common gate electrode 26 to be connected physically and electrically to the wiring portion 4b of the gate electrode 4 through the contact hole 22f and to be connected physically and electrically to the wiring portion 14b of the gate electrode 14 through the contact hole 22g. Thus, the semiconductor device of FIG. 16 is achieved.

In the semiconductor device constructed as above, the following effects can be achieved, as well as the effect of the first preferred embodiment. First, the electric fields in the end portions of the drain regions 7 and 17 on their sides close to the channel regions 10 and 20 can be relieved to achieve a higher breakdown voltage between the source regions 6, 16 and the drain regions 7, 17 because of their LDD structure. Second, the parasitic resistance in the source regions 6 and 16 can be reduced to carry a large amount of drain current since the source regions 6 and 16 are substantially formed of high-concentration impurity regions not including low-concentration impurity regions.

<The Fourth Preferred Embodiment>

Figure 21:
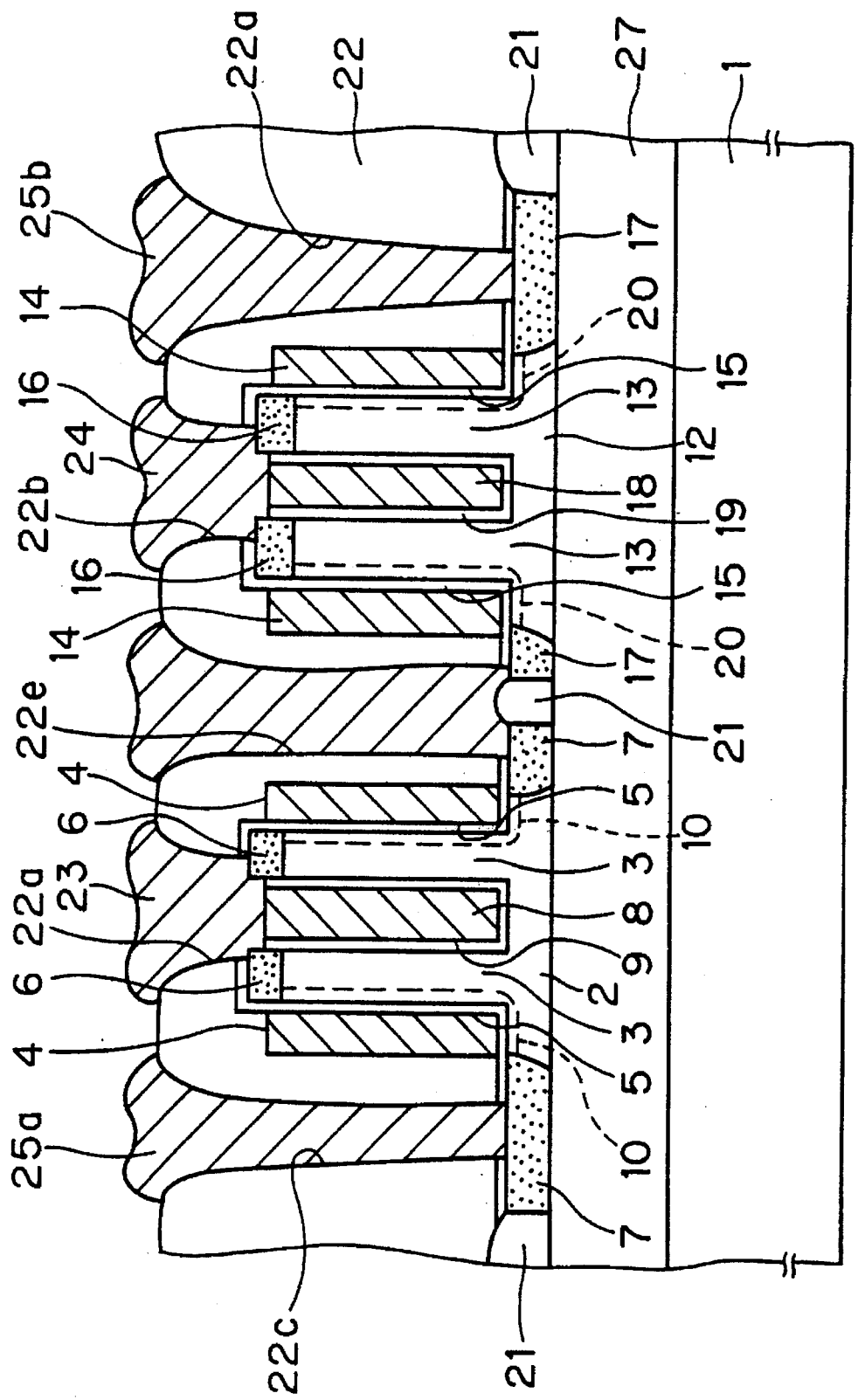
FIG. 21 is a cross-sectional view showing a fourth preferred embodiment of the present invention.

FIG. 21 illustrates the fourth preferred embodiment. An NMOS and a PMOS are provided in a P-type well region and an N-type well region, respectively, both of which are made of SOI (Silicon-on-Insulator) layers on a buried insulating layer formed in the semiconductor substrate 1 in the fourth preferred embodiment, while the NMOS and the PMOS are provided in the P-type well region 2 and the N-type well region 12 formed in the surface of the semiconductor substrate 1 in the first preferred embodiment. Only the above feature is a difference between the first and fourth preferred embodiments and the other features of the fourth preferred embodiment are the same as those of the first preferred embodiment.

In FIG. 21, the same reference numerals and characters as FIG. 1 associated with the first preferred embodiment represent the same or like elements. The semiconductor substrate 1 is formed of a silicon substrate having a buffed insulating layer 27 which is formed of an oxide film with a prescribed thickness, provided at the depth ranging from 0.4 μm to 1.1 μm (specifically, 0.6 μm) from the surface of the semiconductor substrate 1. For the semiconductor substrate 1, an SOI substrate made by bonding another silicon substrate to the buried insulating layer 27 which is formed by thermal oxidation of a bottom surface of the silicon substrate at a high temperature of about 1000° C. and polishing a surface of the silicon substrate, or an SIMOX (Separation by Implanted Oxygen) substrate including the buffed insulating layer 27 which is formed at the prescribe depth of the semiconductor substrate by ion implantation with oxygen at a dose of $4\times10^{17}/cm^2$ at an energy ranging from 300 keV to 1500 keV and annealing at a temperature of about 1350° C. is used.

The P-type well region 2 is formed of a P-type semiconductor region as the first semiconductor region (SOI layer) provided in the surface of the semiconductor substrate 1 (above the buried insulating layer 27), having the major surface and the pillar-like portion 3 projecting uprightly from its major surface with the vertical outer peripheral surface 3a as the outside face and the inner peripheral surface 3b as the inside face positioned in an opposite side to the outside face. This P-type well region 2 is formed by ion implantation with boron (B) at a dose ranging from $1\times10^{12}/cm^2$ to $3\times10^{12}/cm^2$ and at an energy ranging from 50 keV to 100 keV, and has almost uniform concentration of $1\times10^{17}/cm^3$ in a direction of depth from the upper end surface of the pillar-like projection 3. The pillar-like projection 3 has a height ranging from 0.3 μm to 1 μm (specifically, 0.5 μm) and a thickness ranging from 600 Å to 1200 Å (specifically, 1000 Å). Furthermore, a height from a surface of the buried insulating layer 27 to the major surface ranges from 1000 Å to 2000 Å.

The N-type source region 6 of the NMOS is formed in the upper end portion of the pillar-like projection 3 of the P-type well region 2, by ion implantation with arsenic (As) at a dose ranging from $4\times10^{15}/cm^2$ to $6\times10^{15}/cm^2$ at an energy of 40 keV, and has a diffused layer depth ranging from 1000 Å, to 2000 Å from the upper end surface of the pillar-like projection 3 and a concentration ranging from $2\times10^{20}/cm^3$ to $6\times10^{20}/cm^3$.

The N-type drain region 7 of the NMOS is formed in the upper surface of the P-type well region 2 so as to partly overlap the bottom surface of the electrode portion 4a of the gate electrode 4 with its bottom surface in contact with the buried insulating layer 27, having a concentration ranging from $2\times10^{20}/cm^3$ to $6\times10^{20}/cm^3$.

The N-type well region 12 is formed of an N-type semiconductor region as the second semiconductor region (SOI layer) provided in the surface of the semiconductor substrate 1 (above the buried insulating layer 27), having the major surface and the pillar-like portion 13 projecting uprightly from the major surface with the vertical outer peripheral surface 13a as the outside face and the inner peripheral surface 13b as the inside face positioned in an opposite side to the outside face. The N-type well region is formed by ion implantation with phosphorus (P) at a dose ranging from $1\times10^{12}/cm^2$ to $3\times10^{12}/cm^2$ at an energy ranging from 50 keV to 100 keV, and has almost uniform concentration of $1\times10^{16}/cm^3$ in a direction of depth from an upper end surface of the pillar-like projection 13. The pillar-like projection 13 has a height ranging from 0.3 µm to 1 µm (specifically, 0.5 µm) and a thickness ranging from 800 Å to 1200 Å (specifically, 1000 Å). Furthermore, a height from the surface of the buried insulating layer 27 to the major surface ranges from 1000 Å to 2000 Å.

The P-type source region 16 of the PMOS is formed in the upper end portion of the pillar-like projection 13 of the N-type well region 12, by ion implantation with boron (B) at a dose ranging $4\times10^{15}/cm^2$ to $6\times10^{15}/cm^2$ at an energy of 20 keV, and has a diffused layer depth ranging from 2000 Å to 4000 Å from the upper end surface of the pillar-like projection 13 and a concentration ranging from $1.5\times10^{20}/cm^3$ to $3\times10^{20}/cm^3$.

The P-type drain region 17 of the PMOS is formed in the upper surface of the N-type well region 12 so as to partly overlap the electrode portion 14a of the gate electrode 14, and has a concentration ranging from $1.5\times10^{20}/cm^3$ to $3\times10^{20}/cm^3$.

The isolation insulating film 21 is formed of a silicon oxide film provided in the surface of the semiconductor substrate 1 (above the buried insulating layer 27), so as to surround the NMOS and the PMOS separately, that is, so as to surround the N-type well region 2 of SOI layer and the P-type well region 12 of SOI layer separately, to electrically isolate the NMOS and the PMOS from each other. This isolation insulating film 21 is in contact with the upper surface of the buried insulating layer 27 and has a thickness ranging from 2000 Å to 4000 Å.

Now, referring to FIGS. 22 to 27, a method of manufacturing the semiconductor device constructed as above configuration will be discussed.

Figure 22:
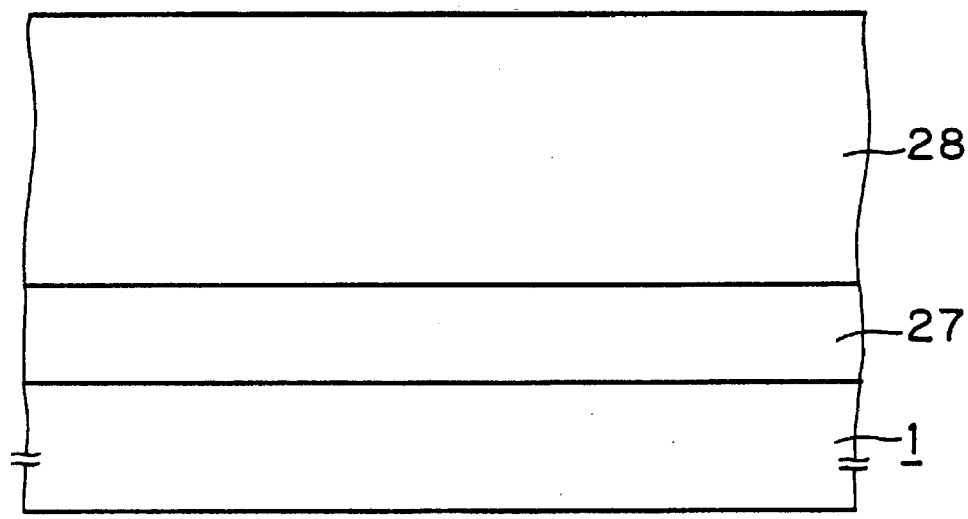
FIGS. 22 to 27 are cross-sectional views sequentially showing steps of a manufacturing method in accordance with the fourth preferred embodiment of the present invention.

At the outset, as shown in FIG. 22, the semiconductor substrate 1 formed of a silicon substrate, such as the SOI substrate or the SIMOX substrate, is prepared, being provided with the buried insulating layer 27 which is formed of an oxide film with a prescribed thickness at the prescribed depth, e.g., ranging from 0.4 µm to 1.1 µm (specifically, 0.6 µm).

Next, a region for the N-type well to be formed in the surface of the semiconductor substrate 1 is masked by a resist and a region for the P-type well to be formed is ion-implanted with boron (B) at a dose ranging from $1\times10^{12}/cm^2$ to $3\times10^{12}/cm^2$ at an energy ranging from 50 keV to 100 keV, to form the P-type well region. At this time, the P-type well region has almost uniform boron-concentration of $1\times10^{17}/cm^3$ in the direction of depth from its surface to the surface of buried insulating layer 27.

Next, the P-type well region is masked by the resist and the region for the N-type well region to be formed in the semiconductor substrate 1 is ion-implanted with phosphorus (P) at a dose ranging from $1\times10^{12}/cm^2$ to $3\times10^{12}/cm^2$ at an energy ranging from 50 keV to 100 keV, to form the N-type well region. At this time, the N-type well region has almost uniform phosphorus-concentration of $1\times10^{16}/cm^3$ in the direction of depth from its surface to the surface of buried insulating layer 27.

Figure 23:
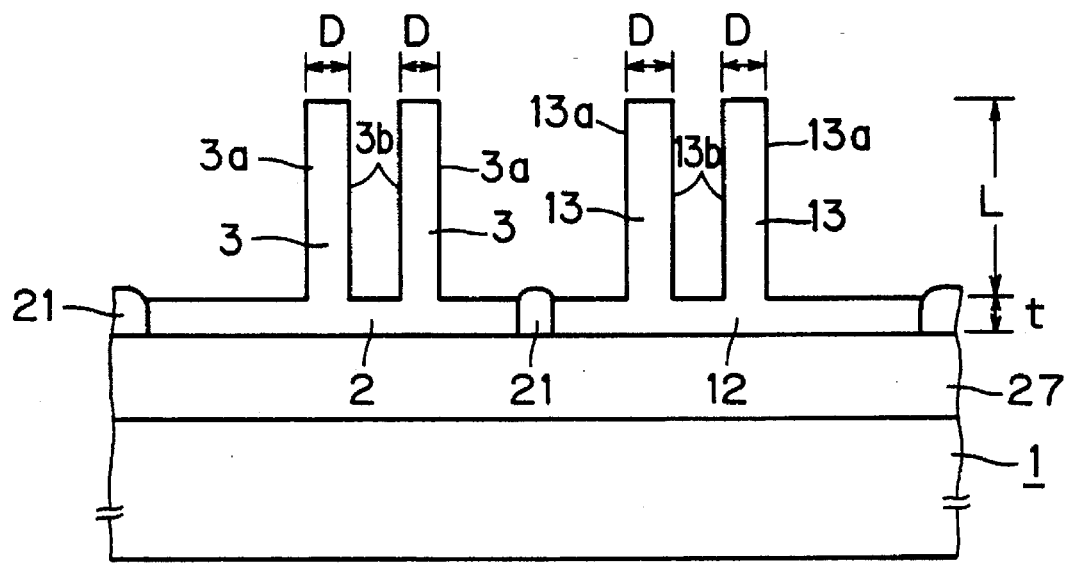

To form the NMOS and the PMOS, a prescribed region of the P-type well region (a region for the pillar-like projection 3 to be formed in the fourth preferred embodiment) and a prescribed region of the N-type well region (a region for the pillar-like projection 13 to be in the fourth preferred embodiment) are masked by the resist and are subjected to a dry etching antisotropically, to form the P-type well region 2 having the pillar-like projection 3 and the N-type well region 12 having the pillar-like projection 13, as shown in FIG. 23.

The etching is performed so that the etching depth may be determined in accordance with the design rules of the NMOS and the PMOS. For example, in manufacturing the semiconductor device under a 0.5 µm rule, the etching depth, i.e., the height L of the pillar-like projections 3 and 13 is 0.5 µm, where the thickness D of the pillar-like projections 3 and 13 is determined to be 1000 Å. Furthermore, the height t from the surface of the buried insulating layer 27 to the major surface ranges from 1000 Å to 2000 Å.

The height L of the pillar-like projections 3 and 13 is not restricted as above, but may ranges from 0.3 µm to 1 µm. The thickness D thereof is not restricted as above, either, but may ranges from 600 Å to 1200 Å depending on the threshold voltage.

The isolation insulating film 21 which is a silicon oxide film to electrically isolate the NMOS and the PMOS from each other is formed by a commonly-known LOCOS method as far as it reaches the surface of the buried insulating layer 27. The buried insulating layer 27 has a thickness ranging from 2000 Å to 4000 Å. This isolation insulating film 21 is also necessarily formed at the interface between the P-type well region 2 and the N-type well region 12.

Figure 24:
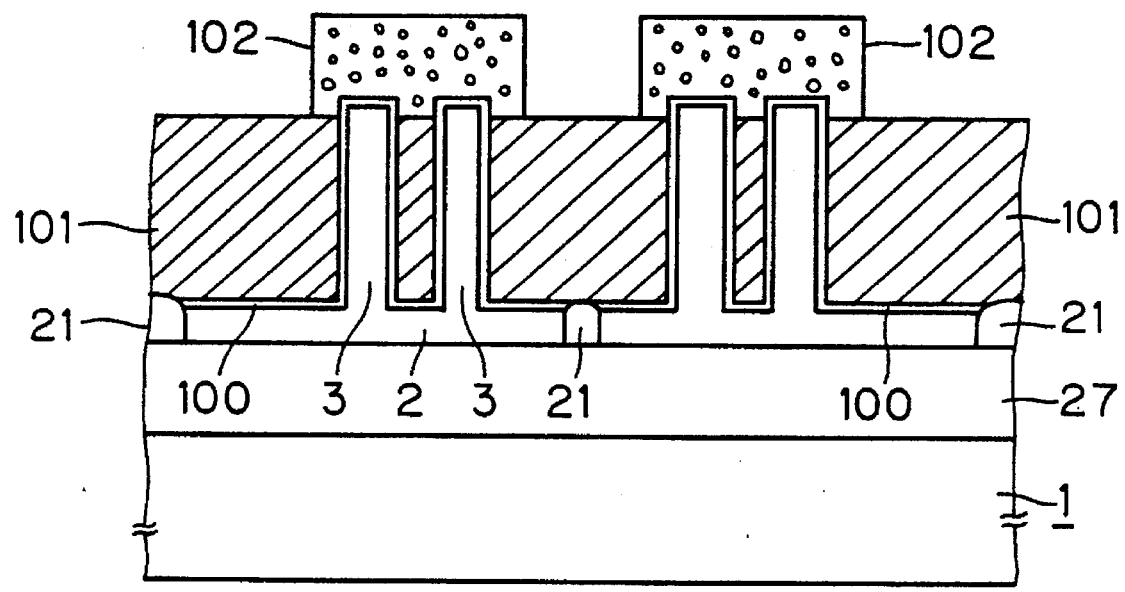

In a subsequent step to form the gate insulating film 5 and the back gate insulating film 9, as shown in FIG. 24, the upper surface of the semiconductor substrate 1, i.e., the major surface of the P-type well region 2 including the pillar-like projection 3 and the major surface of the N-type well region 12 including the pillar-like projection 13 are thermally oxidized, to form the silicon oxide film 100 with a thickness ranging from 60 Å to 100 Å.

To form the gate electrode 4 and the back gate electrode 8 of the NMOS and the gate electrode 14 and the back gate electrode 18 of the PMOS, the polysilicon layer 101 having a phosphorus-concentration of $4\times10^{29}/cm^3$ or more is deposited on the upper surface of the semiconductor substrate 1, i.e., on the silicon oxide film 100 and the isolation insulating film 21 as far as it reaches a position lower than the upper end surface of the pillar-like projections 3 and 13 by 500 Å to 8000 Å.

The polysilicon layer 101 is formed by a CVD method with polysilicon made by thermal decomposition of $SiH_4$-$H_2$ in the $PH_3$-mixed atmosphere, where the formation temperature ranges 600° C. to 900° C. and the growth rate is controlled to be 20 Å/min. The film-thickness uniformity is ±5 Å in a wafer surface.

A resist layer is formed over the whole surface of the polysilicon layer 101 and etched to leave regions in the polysilicon layer 101 for the gate electrode 4 and the back gate electrode 8 of the NMOS and the gate electrode 14 and the back gate electrode 18 of the PMOS to be formed, and the patterned resist layer 102 is formed.

Figure 25:
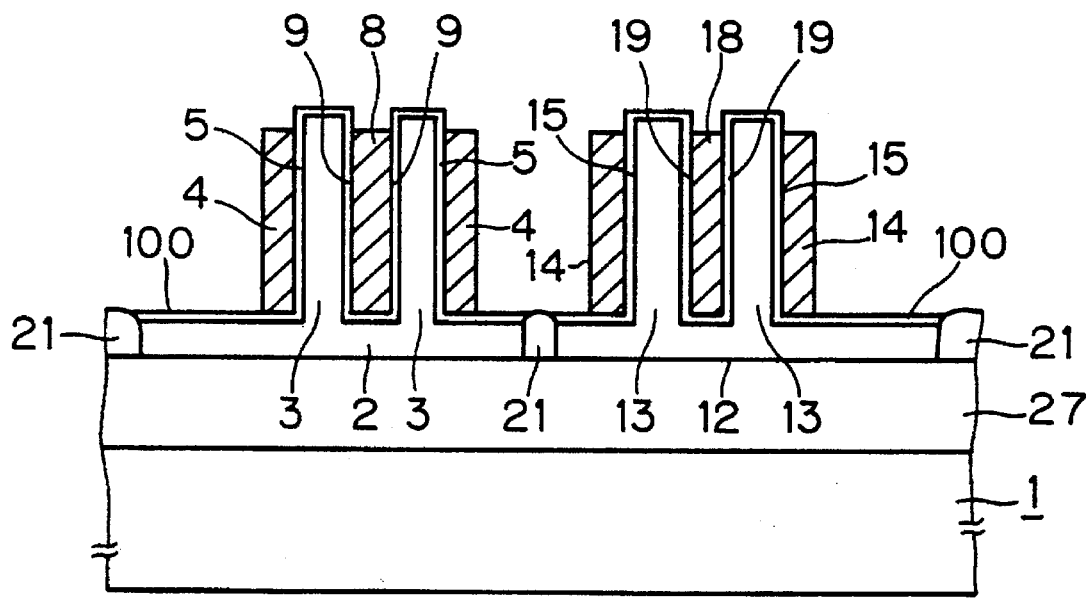

Using the patterned resist layer 102 as a mask, the polysilicon layer 101 is etched, as shown in FIG. 25, to form the gate electrode 4 and the back gate electrode 8 of the NMOS and the gate electrode 14 and the back gate electrode 18 of the PMOS.

The polysilicon layer 101 is subjected to a reactive etching in the atmosphere of mixed gas composed of $CCl_4$, $Cl_2$, He and the like.

Figure 26:
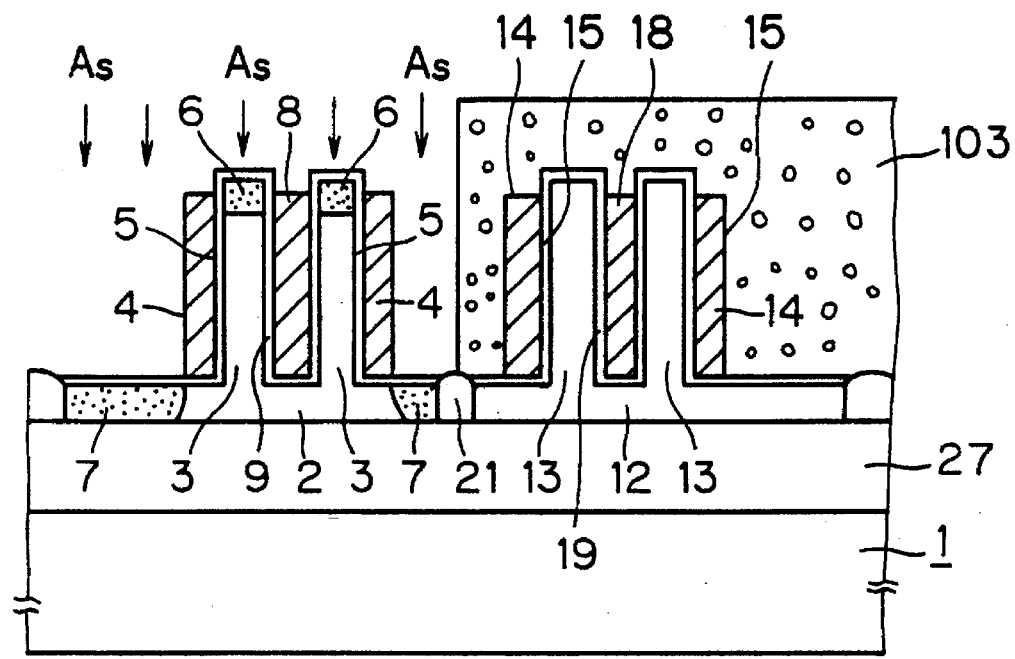

Subsequently, as shown in FIG. 26, a resist layer is formed on the surface of the semiconductor substrate 1 and etched to expose a region for the NMOS to be formed, and thus the patterned resist layer 103 is formed.

Using the patterned resist layer 103 as a mask, ion implantation is performed with arsenic at a dose ranging from $4 \times 10^{15}/cm^2$ to $6 \times 10^{15}/cm^2$ at an energy of 40 keV.

As the result, in a self-aligned manner with a function of the gate electrode 4 and back gate electrode 8 as a mask, the N-type source region 6 of the NMOS is formed in the upper end surface of pillar-like projection 3, having a diffused layer depth ranging from 1000 Å, to 2000 Å, and a concentration ranging from $2 \times 10^{20}/cm^3$ to $6 \times 10^{20}/cm^3$. It is preferable that the source region 6 may be formed so as to partly overlap the gate electrode 4 and the back gate electrode 8.

Moreover, in a self-aligned manner with a function of the gate electrode 4 and isolation insulating film 21 as a mask, the N-type drain region 7 of the NMOS is formed in the major surface of the P-type well region 2 positioned between the gate electrode 4 and the isolation insulating film 21, having a diffused layer depth ranging from 1000 Å to 2000 Å and a concentration ranging from $2 \times 10^{20}/cm^3$ to $6 \times 10^{20}/cm^3$. The drain region 7 partly overlaps the gate electrode 4.

Thus, the vertical N-MOS transistor is formed, having the gate electrode 4 opposed to the outer peripheral surface 3a of the pillar-like projection 3 of the P-type well region 2 with the gate insulating film 5 interposed therebetween, with its bottom surface opposed to the major surface of the P-type well region 2 with the gate insulating film 5 interposed therebetween, the source region 6 provided in the upper end surface of the pillar-like projection 3, the drain region 7 provided in the major surface of the P-type well region 2, partly overlapping the bottom surface of the gate electrode 4, and the back gate electrode 8 opposed to the inner peripheral surface 3b of the pillar-like projection 3 with the back gate insulating film 9 interposed therebetween.

Figure 27:
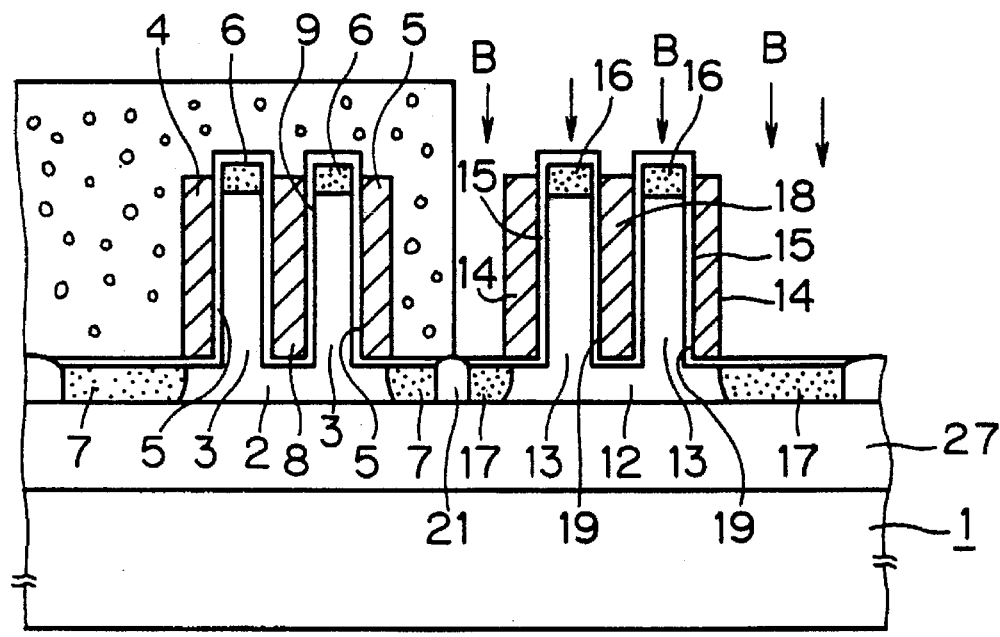

After removing the resist layer 103, a resist layer is formed on the surface of the semiconductor substrate 1 and etched to expose a region for the PMOS to be formed, and thus the patterned resist layer 104 is formed, as shown in FIG. 27.

Using the patterned resist layer 104 as a mask, ion implantation is performed with boron at a dose ranging from $4 \times 10^{15}/cm^2$ to $6 \times 10^{15}/cm^2$ at an energy of 20 keV.

As the result, in a self-aligned manner with a function of the gate electrode 14 and back gate electrode 18 as a mask, the P-type source region 16 of the PMOS is formed in the upper end surface of pillar-like projection 3, having a diffused layer depth ranging from 2000 Å to 4000 Å, and a concentration ranging from $1.5 \times 10^{20}/cm^3$ to $3 \times 10^{20}/cm^3$. It is preferable that the source region 16 may be formed so as to partly overlap the gate electrode 14 and the back gate electrode 18.

Moreover, in a self-aligned manner with a function of the gate electrode 14 and isolation insulating film 21 as a mask, the P-type drain region 17 of the PMOS is formed in the major surface of the N-type well region 12 positioned between the gate electrode 14 and the isolation insulating film 21, having a diffused layer depth ranging from 2000 Å to 4000 Å and a concentration ranging from $1.5 \times 10^{20}/cm^3$ to $3 \times 10^{20}/cm^3$. The drain region 17 partly overlaps the gate electrode 14.

Thus, the vertical P-MOS transistor is formed, having the gate electrode 14 opposed to the outer peripheral surface 13a of the pillar-like projection 13 of the N-type well region 12 with the gate insulating film 15 interposed therebetween, with its bottom surface opposed to the major surface of the N-type well region 12 with the gate insulating film 15 interposed therebetween, the source region 16 provided in the upper end surface of the pillar-like projection 13, the drain region 17 provided in the major surface of the N-type well region 12, partly overlapping the bottom surface of the gate electrode 14, and the back gate electrode 18 opposed to the inner peripheral surface 13b of the pillar-like projection 13 with the back gate insulating film 19 interposed therebetween.

The resist layer 104 is thereafter removed to form the interlayer insulating film 22 with a thickness of 7000 Å on the whole surface of said semiconductor substrate 1. In the interlayer insulating film 22, the contact hole 22a over the upper end surface of the back gate electrode 8 and part of the upper end surface of the pillar-like projection 3 on its side close to the back gate electrode 8, the contact hole 22b over the upper end surface of the back gate electrode 18 and part of the upper end surface of the pillar-like projection 13 on its side close to the back gate electrode 18, the contact hole 22c over the drain region 7, the contact hole 22d over the drain region 17, the contact hole 22e over the drain region 7 and the drain region 17, the contact hole 22f over the wiring portion 4b of the gate electrode 4 and the contact hole 22g over the wiring portion 14b of the gate electrode 14 are formed by a commonly-known photolithographic technique.

Subsequently, the metal layer made of e.g., aluminum or aluminum alloy mainly composed of aluminum is vapor-deposited by sputtering over the whole interlayer insulating film 22 including the contact holes 22a to 22g.

Patterning the metal layer by the commonly-known photolithographic technique forms the first source electrode 23 to be connected physically and electrically to the source region 6 and the back gate electrode 8 through the contact hole 22a and to be connected to the second supply potential node through the interconnection layer which is formed integrally therewith and extends on the interlayer insulating film 22, the second source electrode 24 to be connected physically and electrically to the source region 16 and the back gate electrode 18 through the contact hole 22b and to be connected to the first supply potential node through the interconnection layer which is formed integrally therewith and extends on the interlayer insulating film 22, the first drain electrode 25a to be connected physically and electrically to the drain region 7 through the contact hole 22c, the second drain electrode 25b to be connected physically and electrically to the drain region 17 through the contact hole 22d, the third drain electrode 25c to be connected physically and electrically to the drain regions 7 and 17 through the contact hole 22e, the connection portion 25d formed integrally with the drain electrodes 25a to 25c on the interlayer insulating film 22 and the common gate electrode 26 to be connected physically and electrically to the wiring portion 4b of the gate electrode 4 through the contact hole 22f and to be connected physically and electrically to the wiring portion 14b of the gate electrode 14 through the contact hole 22g. Thus, the semiconductor device of FIG. 21 is achieved.

In the semiconductor device constructed as above, when the NMOS is formed on the P-type well region 2 having a concentration of $1 \times 10^{17}/cm^3$ and the pillar-like projection 3 has a thickness of 1000 Å the NMOS operates with a threshold voltage of 0.6 V, being partially depleted, achieves a high drain breakdown voltage and effectively draws excessive carriers from the channel 10. Furthermore, since the back gate electrode 8 is supplied with the same potential as the source region 6 is supplied, i.e, the grounded potential in the fourth preferred embodiment, the NMOS ensures stability of its operation.

On the other hand, when the PMOS is formed on the N-type well region 12 having a concentration of $1\times10^{16}/cm^3$ and the pillar-like projection 13 has a thickness of 1000 Å the PMOS operates with a threshold voltage of 0.9 V in absolute value, being fully depleted. Furthermore, since the back gate electrode 18 is supplied with the same potential as the source region 16 is supplied, i.e, the power supply potential, a potential difference in the channel region 20 through the back gate insulating film 19 effectively becomes 0 V to thereby achieve a strong punch-through resistance and an excellent short channel effect leading to a stable operation.

Alternatively the pillar-like projections 3 and 13 may be different in height, though they have the same height L in the fourth preferred embodiment, and thereby transistors with a variety of gate lengths (depending on the height of pillar-like projection) can be formed on the semiconductor substrate 1.

That can be easily achieved only by changing the etching mask used in forming the pillar-like projections for transistor formation.

In the semiconductor device as above constructed, since the bottom surfaces of the drain regions 7 and 17 of the NMOS and the PMOS come into contact with the buried insulating layer 27, an effect of reducing a PN junction capacitance (parasitic capacitance) at the interface between the drain regions 7, 17 and the well regions 2, 12 can be achieved, as well as the same effect as in the first preferred embodiment, thereby ensuring an operation of the inverter circuit with high speed and low power consumption.

Although the inverter circuit has been discussed as an example in the fourth preferred embodiment, a use of the semiconductor device is not restricted to that, but any circuit using the semiconductor device can operate with high speed and low power consumption.

<The Fifth Preferred Embodiment>

Although the semiconductor device of the fourth preferred embodiment includes the pillar-like projections 3 and 13 of the same thickness, the pillar-like projections 3 and 13 may be different in thickness to achieve a variety of threshold voltages.

Transistors with a variety of threshold voltages, of which the pillar-like projections are different from each other in thickness, can be easily achieved only by changing the etching mask used in forming the pillar-like projections 3 and 13 for transistor formation in the fourth preferred embodiment. In this case, variation of threshold voltage is achieved without changing the concentration in the channel regions, resulting in a simplified process. That is, since the channel regions 10 and 20 in the NMOS and the PMOS have the same impurity concentration, the well regions 2 and 12 each require only one ion-implantation mask for their formation. Furthermore the pillar-like projections 3 and 13 also require only one etching mask to form MOSs with different threshold voltages.

Figure 28:
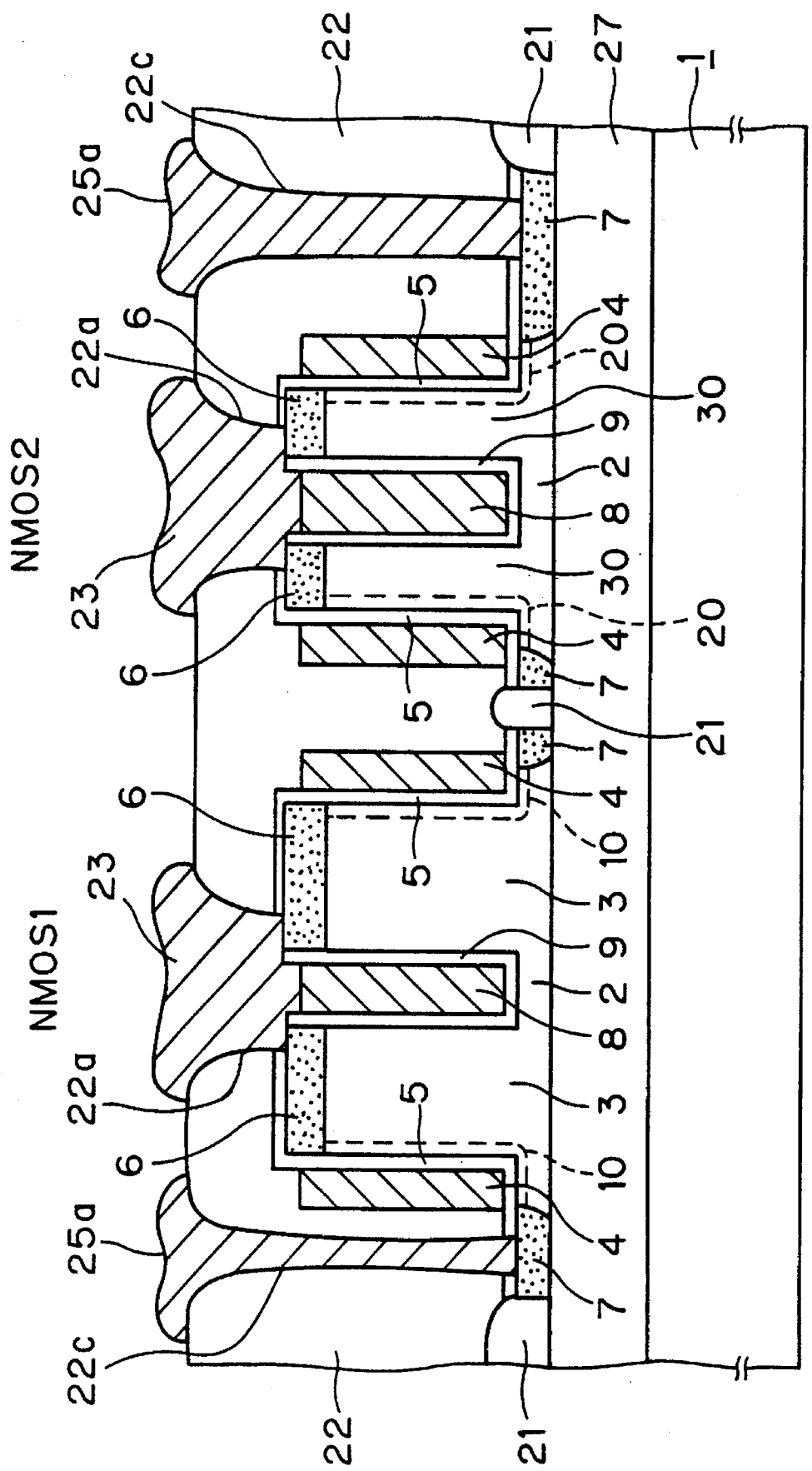
FIG. 28 is a cross-sectional view showing a fifth preferred embodiment of the present invention.

FIG. 28 is a cross-sectional view illustrating the fifth preferred embodiment. Two NMOSs which are different from each other in threshold voltage are shown. The NMOS 1 shown in the left of the figures includes the pillar-like projection 3 having a thickness of 1000 Å and obtains a threshold voltage of 0.6 V, and the NMOS 2 shown in the right of the figures includes the pillar-like projection 30 having a thickness of 600 Å and obtains a threshold voltage of 0.3 V.

Thus, a variety of threshold voltages can be achieved only by changing thicknesses of the pillar-like projections.

For example, The NMOS including the pillar-like projection 3 with a concentration of $1\times10^{17}/cm^3$ and a thickness ranging from 600 Å, to 1200 Å obtains a threshold voltage ranging from 0.3 V to 0.8 V, and the PMOS including the pillar-like projection 13 with a concentration of $1\times10^{26}/cm^3$ and a thickness ranging from 600 Å to 1200 Å obtains a threshold voltage ranging from 0.6 V to 1.1 V.

In FIG. 28, the same reference numerals and characters as those of FIG. 21 represent/he same or like elements.

Alternatively, as is clear from the above discussion, the pillar-like projections 3 and 13 of the NMOS and the PMOS may be different from each other in thickness to achieve the NMOS and the PMOS which are different from each other in threshold value, although two NMOSs which are different in threshold voltage are shown in FIG. 28.

<The Sixth Preferred Embodiment>

Figure 29:
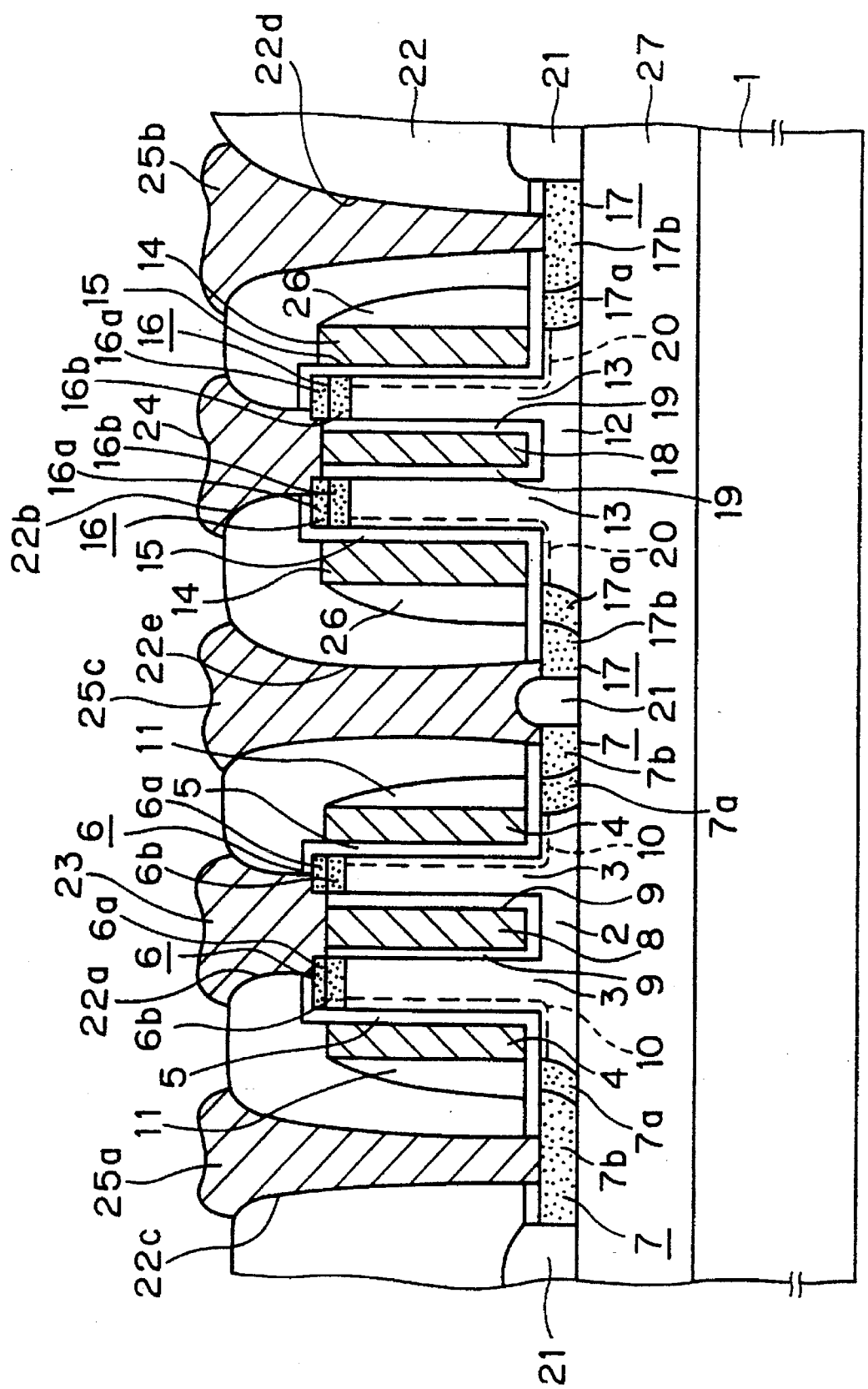
FIG. 29 is a cross-sectional view showing a sixth preferred embodiment of the present invention.
Figure 30:
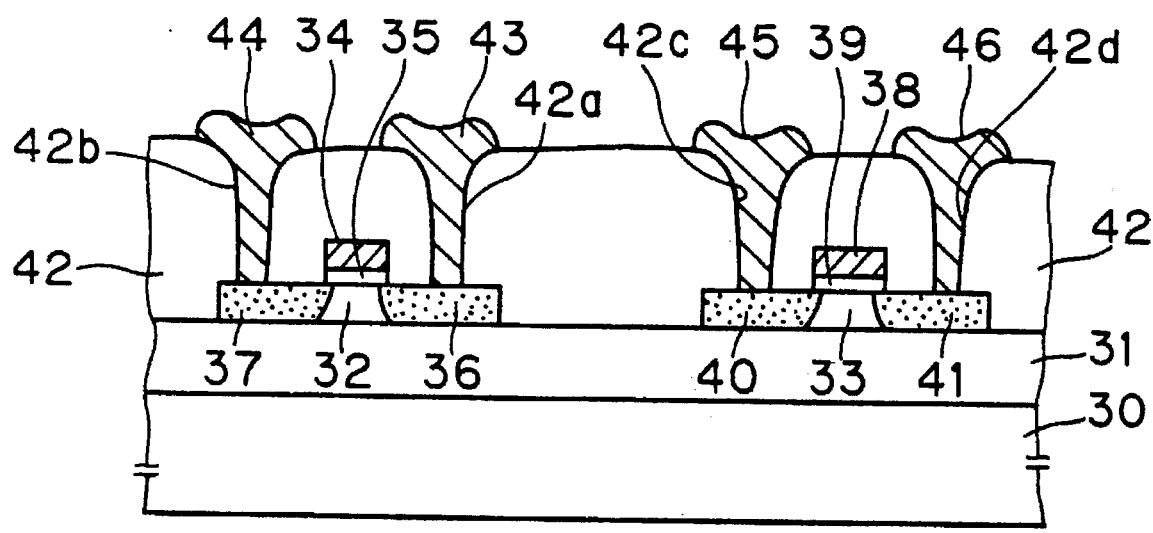
FIG. 30 is a cross-sectional view of a semiconductor device in a background art.

FIG. 29 illustrates the sixth preferred embodiment. The sixth preferred embodiment is different from the fourth preferred embodiment only in that the drain region 7 of the NMOS has the LDD structure and the drain region 17 of the PMOS also has the LDD structure. Other features are the same as those of the fourth preferred embodiment.

In FIG. 29, the same reference numerals and characters as those of FIG. 21 associated with the fourth preferred embodiment represent the same or like elements. The source region 6 is formed by ion implantation with phosphorus (P) at a dose ranging from $4\times10^{23}/cm^2$ to $6\times10^{23}/cm^2$ at an energy of 40 keV and further ion implantation with arsenic (As) at a dose ranging from $4\times10^{15}/cm^2$ to $6\times10^{15}/cm^2$ at an energy of 40 keV and has a concentration ranging from $2\times10^{20}/cm^3$ to $6\times10^{20}/cm^3$. The low-concentration impurity region 7a is formed by ion implantation with phosphorus (P) at a dose ranging from $4\times10^{13}/cm^2$ to $6\times10^{13}/cm^2$ at an energy of 40 keV and has a concentration ranging from $1\times10^{17}/cm^3$ to $6\times10^{17}/cm^3$, partially overlapping the bottom surface of the gate electrode 4 with its bottom surface in contact with the upper surface of the buried insulating layer 27, and the high-concentration impurity region 7b is formed by ion implantation with arsenic (As) at a dose ranging from $4\times10^{15}/cm^2$ to $6\times10^{15}/cm^2$ at an energy of 40 keV and has a concentration ranging from $2\times10^{20}/cm^3$ to $6\times10^{20}/cm^3$, being apart from the gate electrode 4 with its bottom surface in contact with the upper surface of the buried insulating layer 27. These impurity regions 7a and 7b constitute the drain region 7 of the NMOS.

The source region 16 is formed by ion implantation with boron (B) at a dose ranging from $4\times10^{13}/cm^2$ to $6\times10^{13}/cm^2$ at an energy of 20 keV and again at a dose ranging from $4\times10^{15}/cm^2$ to $6\times10^{15}/cm^2$ at an energy of 20 keV and has a concentration ranging from $1.5\times10^{20}/cm^3$ to $3\times10^{20}/cm^3$. The low-concentration impurity region 17a is formed by ion implantation with boron (B) at a dose ranging from $4\times10^{13}/cm^2$ to $6\times10^{13}/cm^2$ at an energy of 20 keV and has a concentration ranging from $1.5\times10^{17}/cm^3$ to $3\times10^{17}/cm^3$, partially overlapping the bottom surface of the gate electrode 14 with its bottom surface in contact with the upper surface of the buried insulating layer 27, and the high-concentration impurity region 17b is formed by ion implantation with boron (B) at a dose ranging from $4\times10^{15}/cm^2$ to $6\times10^{15}/cm^2$ at an energy of 20 keV and has a concentration ranging from $1.5\times10^{20}/cm^3$ to $3\times10^{20}/cm^3$, being apart from the gate electrode 14 with its bottom surface in contact with the upper surface of the buried insulating layer 27. These impurity regions 17a and 17b constitute the drain region 17 of the PMOS.

Now, a method of manufacturing the above constructed semiconductor device will be discussed below.

First of all, through the steps shown in FIGS. 21 to 25 like in the fourth preferred embodiment, the P-type well region 2 having the pillar-like projection 3 and the N-type well region 12 having the pillar-like projection 13 are so formed as to come into contact with the upper surface of the buried insulating layer 27, and further the isolation insulating film 21, the gate electrode 4 and the back gate electrode 8 of the NMOS and the gate electrode 14 and the back gate electrode 18 of the PMOS are formed.

Subsequently, through the same steps shown in FIGS. 17 to 20 like in the third preferred embodiment, the low-concentration impurity region 6a of the N-type source region 6 of the NMOS and the low-concentration impurity region 7a of the drain region 7 are formed. Further, the side wall 11 is formed along the outer peripheral surface of the gate electrode 4, and the high-concentration impurity region 6b of the N-type source region 6 of the NMOS (at this time, the whole low-concentration impurity region 6a is also subjected to the ion implantation therefor) and the high-concentration impurity region 7b of the drain region 7 are formed. Thus, the vertical N-MOS transistor with the drain region 7 of the LDD structure is formed.

The low-concentration impurity region 16a of the N-type source region 16 of the NMOS and the low-concentration impurity region 17a of the drain region 17 are formed. Further, the side wall 126 is formed along the outer peripheral surface of the gate electrode 14, and the high-concentration impurity region 16b of the N-type source region 16 of the NMOS (at this time, the whole low-concentration impurity region 16a is also subjected to the ion implantation therefor) and the high-concentration impurity region 17b of the drain region 17 are formed. Thus, the vertical P-MOS transistor with the drain region 17 of the LDD structure is formed.

Thereafter, like in the fourth preferred embodiment, the interlayer insulating film 22 is formed. Furthermore, the first source electrode 23 to be connected physically and electrically to the source region 6 and the back gate electrode 8 through the contact hole 22a and to be connected to the second supply potential node through the interconnection layer which is formed integrally therewith and extends on the interlayer insulating film 22, the second source electrode 24 to be Connected physically and electrically to the source region 16 and the back gate electrode 18 through the contact hole 22b and to be connected to the first supply potential node through the interconnection layer which is formed integrally therewith and extends on the interlayer insulating film 22, the first drain electrode 25a to be connected physically and electrically to the drain region 7 through the contact hole 22c, the second drain electrode 25b to be connected physically and electrically to the drain region 17 through the contact hole 22d, the third drain electrode 25c to be connected physically and electrically to the drain regions 7 and 17 through the contact hole 22e, the connection portion 25d formed integrally with the drain regions 25a to 25c on the interlayer insulating film 22 and the common gate electrode 26 to be connected physically and electrically to the wiring portion 4b of the gate electrode 4 through the contact hole 22f and to be connected physically and electrically to the wiring portion 14b of the gate electrode 14 through the contact hole 22g. Thus, the semiconductor device of FIG. 29 is achieved.

In the semiconductor device constructed as above, the following effects can be achieved, as well as the effect of the fourth preferred embodiment. First, the electric fields in the end portions of the drain regions 7 and 17 on their sides close to the channel regions 10 and 20 can be relieved to achieve a higher breakdown voltage between the source regions 6, 16 and the drain regions 7, 17 because of their LDD structure. Second, the parasitic resistance in the source regions 6 and 16 can be reduced to carry a large amount of drain current since the source regions 6 and 16 are substantially formed of high-concentration impurity regions not including low-concentration impurity regions.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:
   (a) a first semiconductor region including,
      (a-1) a major surface, and
      (a-2) a pillar-like portion extending vertically from said major surface, having,
         (a-2-1) an outer surface perpendicular to said major surface, and
         (a-2-2) an inner surface opposite to said outer surface;
   (b) a first gate electrode including,
      (b-1) a side surface opposed to said outer surface of said first semiconductor region with a first gate insulating film interposed therebetween, and
      (b-2) a bottom surface opposed to said major surface of said first semiconductor region with said first gate insulating film interposed therebetween;
   (c) a first source region formed in an upper end portion of said pillar-like portion of said first semiconductor region;
   (d) a first drain region formed in said major surface of said first semiconductor region, having a portion overlapping said bottom surface of said first gate electrode with said first gate insulating film interposed therebetween;
   (e) a first back gate electrode opposed to said inner surface of said first semiconductor region with a first back gate insulating film interposed therebetween; and
   (f) a first source electrode connecting electrically said first source region with said first back gate electrode.

2. The semiconductor device of claim 1, further comprising:
   (f) a semiconductor substrate having a surface in which said first semiconductor region is selectively formed.

3. The semiconductor device of claim 1, wherein
   said outer surface of said first semiconductor region surrounds said inner surface of said first semiconductor region.

4. The semiconductor device of claim 3, wherein
   said first gate electrode surrounds said back gate electrode.

5. The semiconductor device of claim 1, wherein
   said first drain region includes
   (d-1) a low-concentration region having said portion overlapping said bottom surface of said first gate electrode; and
   (d-2) a high-concentration region formed so as to have a distance from said first back gate electrode longer than that of said low-concentration region and an impurity concentration higher than that of said low-concentration region.

6. The semiconductor device of claim 1, further comprising:
   (f) a second semiconductor region including
      (f-1) a major surface; and
      (f-2) a pillar-like portion extending vertically from said major surface of said second semiconductor region, having
         (f-2-1) an outer surface perpendicular to said major surface of said second semiconductor region; and
         (f-2-2) an inner surface opposite to said outer surface of said second semiconductor region;
   (g) a second gate electrode including
      (g-1) a side surface opposed to said outer surface of said second semiconductor region with a second gate insulating film interposed therebetween; and
      (g-2) a bottom surface opposed to said major surface of said second semiconductor region with said second gate insulating film interposed therebetween;
   (h) a second source region formed in an upper end portion of said pillar-like portion of said second semiconductor region;
   (i) a second drain region formed in said major surface of said second semiconductor region, having a portion overlapping said bottom surface of said second gate electrode with said second gate insulating film interposed therebetween; and
   (j) a second back gate electrode opposed to said inner surface of said second semiconductor region with a second back gate insulating film interposed therebetween.

7. The semiconductor device of claim 6, wherein a first thickness between said outer surface of said first semiconductor region and said inner surface of said first semiconductor region and a second thickness between said outer surface of said second semiconductor region and said inner surface of said semiconductor region are different from each other.

8. The semiconductor device of claim 6, wherein said first semiconductor region and said second semiconductor region are of the same conductivity type.

9. The semiconductor device of claim 6, further comprising:
   (k) a first source electrode connecting electrically said first source region with said first back gate electrode; and
   (l) a second source electrode connecting electrically said second source region with said second back gate electrode.

10. The semiconductor device of claim 9, further comprising:
   (m) an output electrode connecting electrically said first drain region with said second drain region,
   wherein said first semiconductor region and said second semiconductor region are different in conductivity type.

11. The semiconductor device of claim 10, further comprising:
   (n) an input electrode connecting electrically said first gate electrode with said second gate electrode,
   wherein a signal received by said input electrode is logically inverted and outputted to said output electrode.

12. The semiconductor device of claim 10, further comprising:
   (n) an isolation insulating film provided at an interface between said major surface of said first semiconductor region and said major surface of said second semiconductor region.

13. The semiconductor device of claim 1, further comprising:
   (f) a substrate having an insulating surface in which said first semiconductor region is formed and with which said first drain region comes into contact.

14. The semiconductor device of claim 13, further comprising:
   (g) a second semiconductor region formed in said insulating surface of said substrate, including
      (g-1) a major surface; and
      (g-2) a pillar-like portion extending vertically from said major surface of said second semiconductor region, having
         (g-2-1) an outer surface perpendicular to said major surface of said second semiconductor region; and
         (g-2-2) an inner surface opposite to said outer surface of said second semiconductor region;
   (h) a second gate electrode including
      (h-1) a side surface opposed to said outer surface of said second semiconductor region with a second gate insulating film interposed therebetween; and
      (h-2) a bottom surface opposed to said major surface of said second semiconductor region with said second gate insulating film interposed therebetween;
   (i) a second source region formed in an upper end portion of said pillar-like portion of said second semiconductor region;
   (j) a second drain region formed in said major surface of said second semiconductor region, having a portion overlapping said bottom surface of said second gate electrode with said second gate insulating film interposed therebetween; and
   (k) a second back gate electrode opposed to said inner surface of said second semiconductor region with a second back gate insulating film interposed therebetween.

15. The semiconductor device of claim 14, wherein a first thickness between said outer surface of said first semiconductor region and said inner surface of said first semiconductor region and a second thickness between said outer surface of said second semiconductor region and said inner surface of said semiconductor region are different from each other.

16. The semiconductor device of claim 13, wherein said first drain region includes
   (d-1) a low-concentration region having said portion overlapping said bottom surface of said first gate electrode; and
   (d-2) a high-concentration region formed so as to have a distance from said first back gate electrode longer than that of said low-concentration region and an impurity concentration higher than that of said low-concentration region.

* * * * *